(12) United States Patent
Tashiro

(10) Patent No.: US 10,985,202 B2
(45) Date of Patent: Apr. 20, 2021

(54) SOLID-STATE IMAGING APPARATUS, ELECTRONIC DEVICE, AND DRIVING METHOD

(71) Applicant: SONY SEMICONDUCTOR SOLUTIONS CORPORATION, Kanagawa (JP)

(72) Inventor: Yoshiaki Tashiro, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/478,375

(22) PCT Filed: Jan. 17, 2018

(86) PCT No.: PCT/JP2018/001090
§ 371 (c)(1),
(2) Date: Jul. 16, 2019

(87) PCT Pub. No.: WO2018/139281
PCT Pub. Date: Aug. 2, 2018

(65) Prior Publication Data
US 2019/0371850 A1    Dec. 5, 2019

(30) Foreign Application Priority Data
Jan. 30, 2017    (JP) .............................. JP2017-014302

(51) Int. Cl.
*H01L 27/146* (2006.01)
*H04N 5/359* (2011.01)
*H04N 5/361* (2011.01)

(52) U.S. Cl.
CPC .. *H01L 27/14643* (2013.01); *H01L 27/14601* (2013.01); *H04N 5/359* (2013.01); *H04N 5/361* (2013.01)

(58) Field of Classification Search
CPC ............. H01L 27/146; H01L 27/14601; H01L 27/14609; H01L 27/14634;
(Continued)

(56) References Cited

U.S. PATENT DOCUMENTS

2004/0099920 A1*  5/2004  Rossi .................... H04N 5/361
                                                     257/448
2012/0035419 A1*  2/2012  Ashida ................. A61B 1/0002
                                                     600/109
(Continued)

FOREIGN PATENT DOCUMENTS

CN    104101997 A    10/2014
CN    107251544 A    10/2017
(Continued)

OTHER PUBLICATIONS

International Search Report and Written Opinion of PCT Application No. PCT/JP2018/001090, dated Apr. 17, 2018, 12 pages of ISRWO.

*Primary Examiner* — Allan R Wilson
(74) *Attorney, Agent, or Firm* — Chip Law Group

(57) ABSTRACT

Provided is a solid-state imaging apparatus, an electronic device, and a driving method for obtaining an output signal irrespective of temperature-induced changes in characteristics. The solid-state imaging apparatus includes a pixel array section including a first pixel that has a first photoelectric converting section and obtains an output signal with logarithmic characteristics, and a second pixel that obtains a temperature detection signal for detecting temperature, the first and the second pixels being arranged in a matrix pattern, and a correcting section that corrects the output signal on the basis of temperature information obtained from the temperature detection signal.

13 Claims, 18 Drawing Sheets

(58) Field of Classification Search
CPC ........ H01L 27/14636; H01L 27/14643; H04N
5/35518; H04N 5/359; H04N 5/361;
H04N 5/36963; H04N 5/37452
See application file for complete search history.

(56) References Cited

U.S. PATENT DOCUMENTS

| | | |
|---|---|---|
| 2012/0211642 A1 | 8/2012 | Iwamoto et al. |
| 2014/0307071 A1 | 10/2014 | Hirosawa |
| 2016/0173794 A1* | 6/2016 | Beck ................. H01L 27/14601 |
| | | 348/244 |
| 2018/0191982 A1* | 7/2018 | Berner .................. H04N 5/378 |

FOREIGN PATENT DOCUMENTS

| | | |
|---|---|---|
| EP | 2495956 A1 | 9/2012 |
| JP | 2002-290835 A | 10/2002 |
| JP | 2004-241749 A | 8/2004 |
| JP | 2007-318503 A | 12/2007 |
| JP | 2014-207581 A | 10/2014 |
| WO | 2011/052155 A1 | 5/2011 |
| WO | 2016/147903 A1 | 9/2016 |

* cited by examiner

SOLID-STATE IMAGING APPARATUS, ELECTRONIC DEVICE, AND DRIVING METHOD

CROSS REFERENCE TO RELATED APPLICATIONS

This application is a U.S. National Phase of International Patent Application No. PCT/JP2018/001090 filed on Jan. 17, 2018, which claims priority benefit of Japanese Patent Application No. JP 2017-014302 filed in the Japan Patent Office on Jan. 30, 2017. Each of the above-referenced applications is hereby incorporated herein by reference in its entirety.

TECHNICAL FIELD

The present disclosure relates to a solid-state imaging apparatus, an electronic device, and a driving method. More particularly, the disclosure relates to a solid-state imaging apparatus, an electronic device, and a driving method for obtaining an appropriate output signal irrespective of temperature-induced changes in characteristics.

BACKGROUND ART

Logarithmic image sensors have been known that measure output voltage by letting a photodiode operate as an open circuit similar to a solar cell (e.g., see NPL 1).

The logarithmic image sensor in such solar cell mode utilizes a potential difference generated when a current is allowed to flow in the forward direction of a PN junction, i.e., makes use of the relationship of voltage proportional to the logarithm of current. When the voltage in the forward direction of the PN junction is monitored by replacing the current in the forward direction with a photoelectric current generated by photoelectric conversion, the monitoring provides a signal resulting from logarithmic compression of the photoelectric current.

CITATION LIST

Non Patent Literature

[NPL 1]
"A 768×576 Logarithmic Image Sensor with Photodiode in Solar Cell mode," by Yang Ni, YiMing Zhu, Bogdan Arion, New Imaging Technologies SA, presented on Jun. 9, 2011, at the 2011 International Image Sensor Workshop (IISW), R35.

SUMMARY

Technical Problem

Meanwhile, the logarithmic image sensor in solar cell mode is known to have temperature characteristics in its output voltage. The black level of the logarithmic image sensor in solar cell mode is defined by the thermal equilibrium state of the PN junction. Changes in temperature cause the thermal equilibrium state to transition, which in turn causes the black level to vary. As a result, the temperature characteristics emerge as an offset component in the output signal.

Also with the logarithmic image sensor in solar cell mode, the varying black level causes an appropriate reset level to vary in keeping with temperature. When an inappropriate reset level is set due to the appropriate reset level being varied, there occurs a prolonged period of transition to logarithmic response. Thus with no logarithmic response made in a low light intensity region, the S/N ratio can worsen.

The present disclosure has been devised in view of the above circumstances and proposes allowing a logarithmic image sensor in solar cell mode to obtain an appropriate output signal regardless of temperature-induced changes in characteristics.

Solution to Problem

According to one aspect of the present disclosure, there is provided a solid-state imaging apparatus including: a pixel array section including a first pixel that has a first photoelectric converting section and obtains an output signal with logarithmic characteristics, and a second pixel that obtains a temperature detection signal for detecting temperature, the first and the second pixels being arranged in a matrix pattern; and a correcting section configured to correct the output signal on the basis of temperature information obtained from the temperature detection signal.

Also according to one aspect of the present disclosure, there is provided an electronic device having a solid-state imaging apparatus that includes: a pixel array section including a first pixel that has a photoelectric converting section and obtains an output signal with logarithmic characteristics, and a second pixel that obtains a temperature detection signal for detecting temperature, the first and the second pixels being arranged in a matrix pattern; and a correcting section configured to correct the output signal on the basis of temperature information obtained from the temperature detection signal.

Where the solid-state imaging apparatus and the electronic device according to one aspect of the present disclosure are in use, the output signal with logarithmic characteristics from the first pixel having the first photoelectric converting section is corrected on the basis of the temperature information obtained from the temperature detection signal coming from the second pixel.

Incidentally, the solid-state imaging apparatus or the electronic device according to one aspect of the present disclosure may be either an independent apparatus or an internal block constituting part of a single apparatus.

Also according to one aspect of the present disclosure, there is provided a driving method for use with a solid-state imaging apparatus that includes: a pixel array section including a first pixel that is arranged in an aperture region and obtains an output signal with logarithmic characteristics and a second pixel that is arranged in a light blocking region and obtains a temperature detection signal for detecting temperature, the first and the second pixels being arranged in a matrix pattern; and a correcting section configured to correct the output signal on the basis of temperature information obtained from the temperature detection signal. The first pixel includes: a first photoelectric converting section; a first reset transistor configured to reset the first photoelectric converting section in accordance with a reset signal; a first amplification transistor configured to amplify a signal from the first photoelectric converting section; and a first selection transistor configured to apply a signal from the first amplification transistor onto a vertical signal line in accordance with a selection signal. The second pixel includes: a second photoelectric converting section; a capacitor configured to be connected with the second photoelectric converting section to apply a constant current thereto; a second reset transistor configured to reset the second photoelectric converting section in accordance with a reset signal; a second amplification transistor configured to amplify a signal from the second photoelectric converting section; and a second selection transistor configured to apply a signal from the second amplification transistor onto a vertical signal line in accordance with a selection signal. The driving method includes the step of driving the second reset transistor and the second selection transistor in such a manner that the second photoelectric converting section replaces the constant current with a photoelectric current generated through photoelectric conversion in order to obtain the temperature detection signal.

Where the driving method according to one aspect of the disclosure is in use, the second reset transistor and the second selection transistor are driven in such a manner that the second photoelectric converting section replaces the constant current with a photoelectric current generated through photoelectric conversion in order to obtain the temperature detection signal.

Advantageous Effect of Invention

Thus according to one aspect of the present disclosure, an appropriate output signal is obtained regardless of temperature-induced changes in characteristics.

Incidentally, the advantageous effect outlined above is not limitative of the present disclosure. Further advantages will become apparent from a reading of the present disclosure.

DESCRIPTION OF EMBODIMENTS

Figure 1:
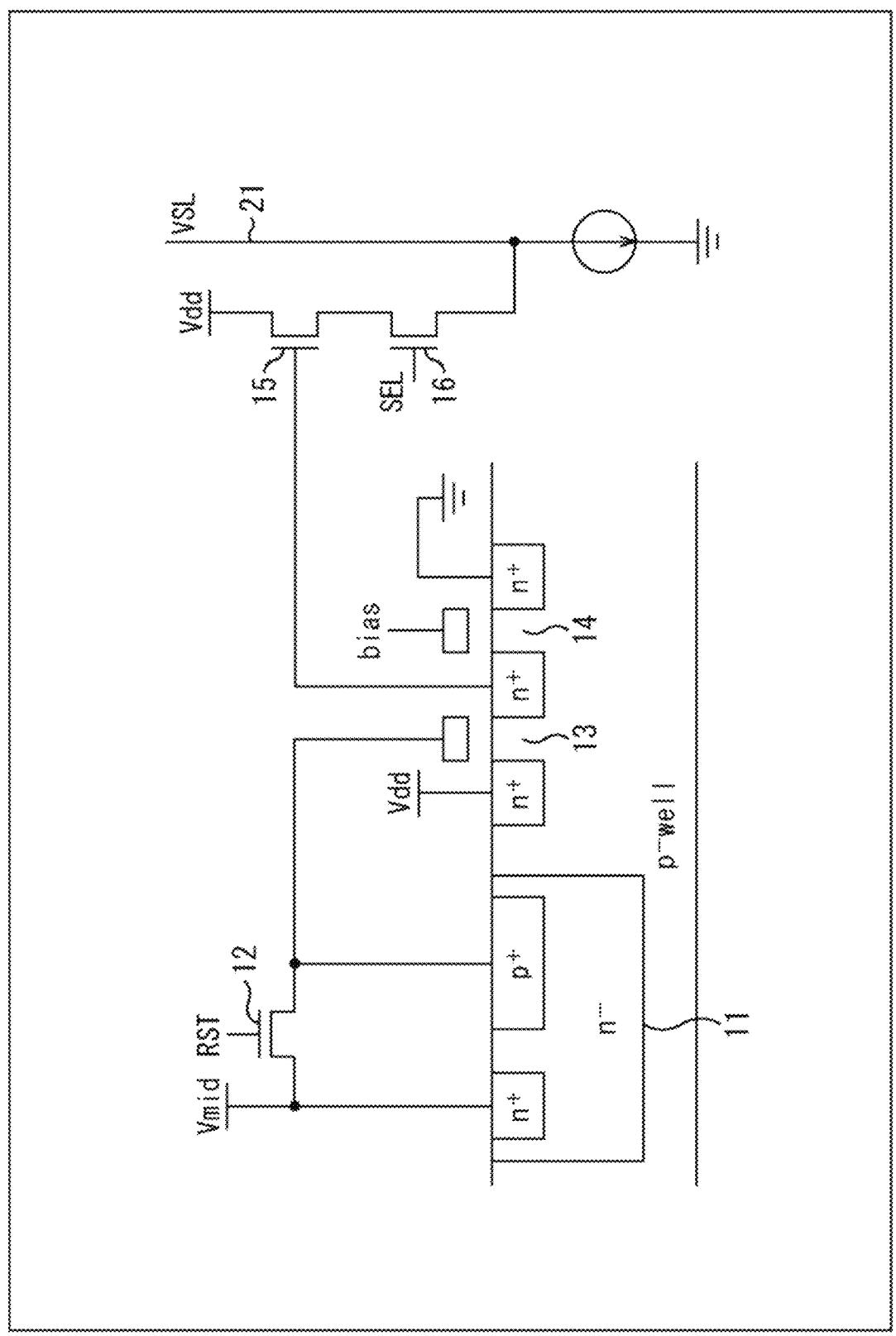
FIG. 1 is a schematic diagram depicting a configuration of a pixel of a common logarithmic image sensor in solar cell mode.

Some embodiments for implementing the technology of the present disclosure (i.e., present technology) are described below with reference to the accompanying drawings. The description is given under the following headings:
1. Overview of the technology of the present disclosure
2. Configuration example of the solid-state imaging apparatus to which the technology of the present disclosure is applied
3. Variations
4. Configuration example of an electronic device including a solid-state imaging apparatus to which the technology of the present disclosure is applied
5. Cross-sectional configuration example of a solid-state imaging apparatus to which the technology of the present disclosure can be applied
6. Configuration examples of a stacked-type solid-state imaging apparatus to which the technology of the present disclosure can be applied
7. Example of application to a mobile body
8. Example of application to an in-vivo information acquisition system 1. Overview of the Technology of the Present Disclosure Configuration of a Pixel of the Logarithmic Image Sensor FIG. 1 is a schematic diagram depicting a configuration of a pixel of a common logarithmic image sensor in solar cell mode.

In FIG. 1, a pixel of the logarithmic image sensor includes a photodiode 11, a reset transistor 12, an amplification transistor 13, a bias transistor 14, an amplification transistor 15, and a selection transistor 16.

The photodiode 11 is a photoelectric conversion section that includes an n-type semiconductor region and a p-type semiconductor region. The reset transistor 12 controls the resetting of the photodiode 11 in accordance with whether a reset signal (RST) applied to the gate electrode of the reset transistor 12 is on or off.

The amplification transistor 13 amplifies a signal that comes to its gate electrode from the photodiode 11, and outputs the amplified signal to the amplification transistor 15. The bias transistor 14 sets a reference current.

The amplification transistor 15 amplifies the signal coming to its gate electrode from the photodiode 11, and outputs the amplified signal to the selection transistor 16. The selection transistor 16 outputs the signal coming from the amplification transistor 15 onto a vertical signal line 21 in accordance with whether a selection signal (SEL) applied to the gate electrode of the selection transistor 16 is on or off.

Incidentally, the pixel of the logarithmic image sensor in FIG. 1 corresponds to one of multiple pixels arranged in a matrix pattern in a pixel array section of the solid-state imaging apparatus such as a CMOS (Complementary Metal Oxide Semiconductor) image sensor.

The multiple pixels arranged in a matrix pattern in the pixel array section are provided with pixel drive lines (not depicted) for supplying a pulse signal to drive the pixels in units of row and with vertical signal lines 21 for supplying a pixel signal generated by each pixel in each column of pixels to a downstream signal processing circuit.

Method of Driving the Pixels of the Logarithmic Image Sensor

Figure 2:
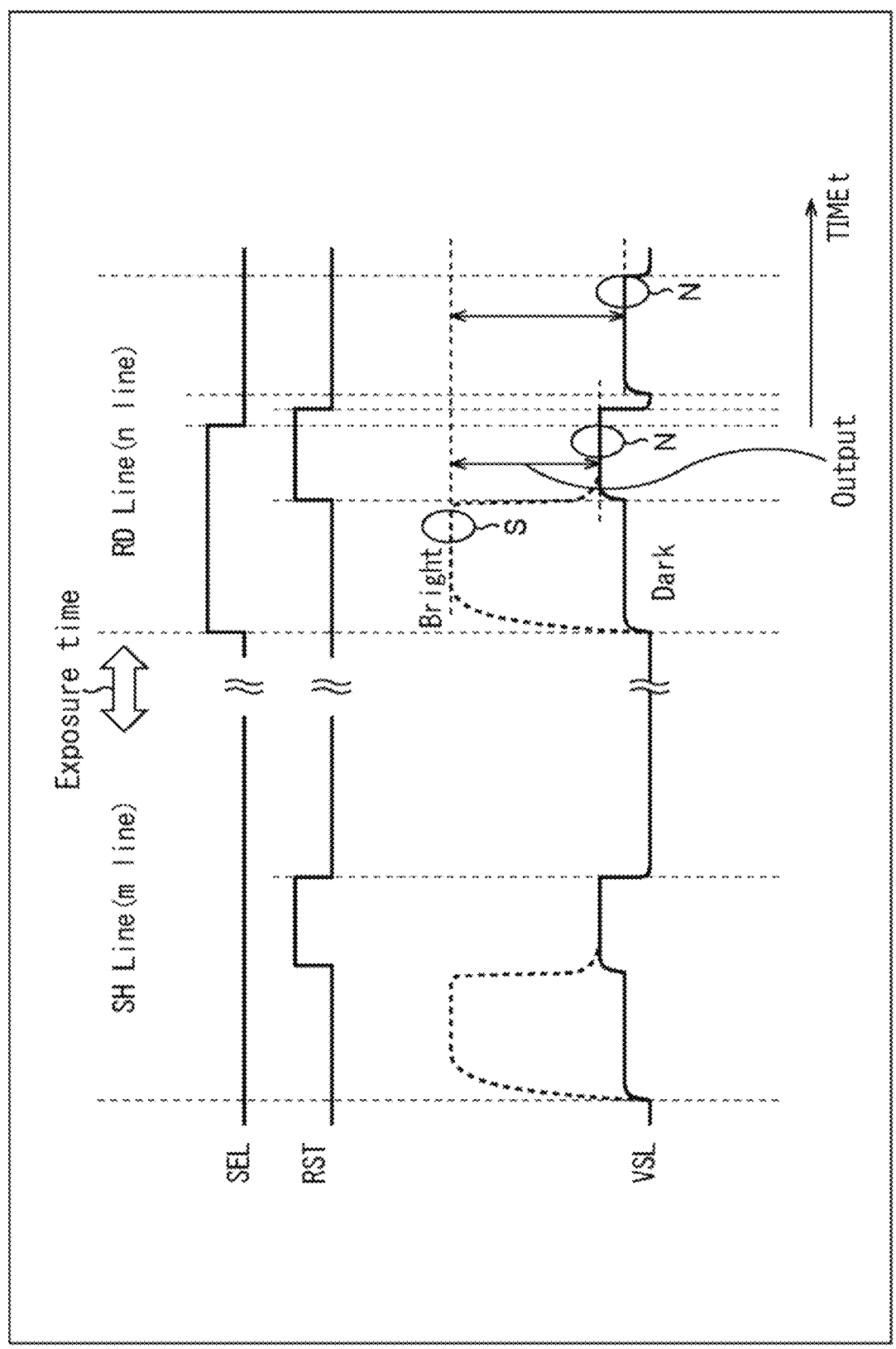
FIG. 2 is a timing chart of assistance in explaining a method of driving a pixel in the common logarithmic image sensor in solar cell mode.

FIG. 2 is a timing chart of assistance in explaining a method of driving a pixel in the common logarithmic image sensor in solar cell mode.

The timing chart of FIG. 2 illustrates in chronological order the levels of three signals: the selection signal (SEL) applied to the gate electrode of the selection transistor 16; the reset signal (RST) applied to the gate electrode of the reset transistor 12; and the signal (VSL) applied to the vertical signal lines 21, in the pixel (FIG. 1) of the logarithmic image sensor.

Also in FIG. 2, an indication SH Line (m line) denotes the period in which to drive a shutter of a horizontal m-th line, and an indication RD Line (n Line) denotes the period in which to drive a horizontal n-th line for a data read subsequent to the m-th line. The period following that of SH Line up to the period of RD Line constitutes an exposure time (the period indicated by a bidirectional arrow in the drawing).

As depicted in FIG. 2, the reset signal (RST) when brought High causes the reset transistor 12 to reset the photodiode 11. Thereafter, the photodiode 11 is electrically charged during the exposure time.

Then the selection signal (SEL) when brought High causes the selection transistor 16 to read the electrical charge from the photodiode 11 as a signal level (S: Signal). Thereafter, the reset signal (RST) brought High resets the photodiode 11, causing the selection transistor 16 to read a noise level (N: Noise). The difference (S-N) between the signal level (S) and the noise level (N) thus obtained constitutes an output signal (Output).

Here, each pixel of the logarithmic image sensor outputs a linear signal (i.e., a signal proportional to light intensity) until the photodiode 11 is electrically charged. Once the photodiode 11 is electrically charged, a current flows exponentially with regard to the generated voltage. This brings about a logarithmic relationship between voltage and current, starting the output of a logarithmic signal.

With each pixel of the logarithmic image sensor, given a sufficient incident light illuminance as indicated by a broken line Bright on the VSL signal in the drawing, capacitance is charged as a result of the PN junction of the photodiode 11. This brings about the output of a signal obtained through logarithmic compression of a photoelectric current in equilibrium state.

Meanwhile, as indicated by a solid line Dark on the VSL signal in the drawing, the capacity of the photodiode 11 may be insufficiently charged under low illuminance conditions involving a low incident light illuminance. In that case, the pixel of the logarithmic image sensor outputs an accumulated signal as an imperfect logarithmic output.

At this point, the output signal at a time of darkness indicated by the solid line Dark on the VSL signal corresponds to the black level. However, changes in temperature cause the thermal equilibrium state to transition (to shift), which in turn varies the black level. Thus, when the black level as the reference is varied, so is the signal upon incidence of light. This causes the temperature characteristics to appear as the offset component of the output signal.

As described above, in the pixel of the common logarithmic image sensor in solar cell mode, the black level is defined by the thermal equilibrium state of the PN junction. Since the black level is dependent on temperature, the output signal is overlaid with the temperature-dependent offset component.

Also, with the black level varied, the appropriate reset level of the photodiode 11 is changed. There occur different reset levels at different temperatures.

Figure 3:
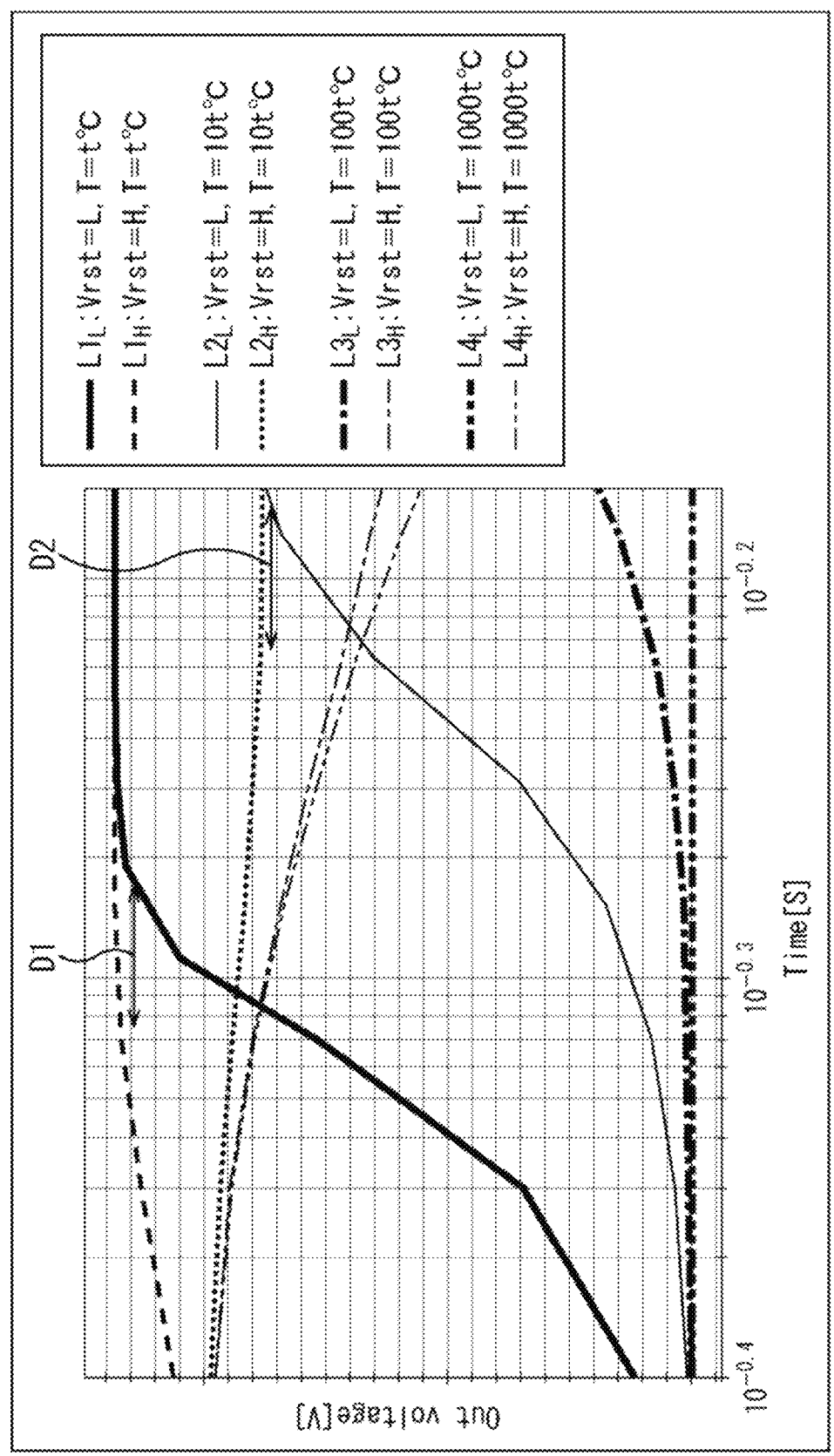
FIG. 3 is a diagram representing relations between reset potential and convergence times, the relations being dependent on potential convergence differences.

FIG. 3 depicts relations between reset level (reset potential) and convergence time, the relations being dependent on potential convergence differences. In FIG. 3, the horizontal axis denotes time (in seconds), and the vertical axis represents the reset level that may be set to the photodiode 11. The higher the reset level on the vertical axis in FIG. 3, the larger the value of that reset level.

A line $L1_L$ and a line $L1_H$ denote the relations between reset level and convergence time at a temperature of t° C. Reference characters "L" and "H" stand for L (Low) reset level (reset potential) and H (High) reset level (reset potential), respectively.

Comparing the line $L1_L$ with the line $L1_H$ where the temperature is t° C. reveals that the line $L1_H$ represents a shorter convergence time than the line $L1_L$. In other words, in a case where the temperature is t° C., setting the H reset level results in a convergence time shorter by time D1, as indicated by a bidirectional arrow in the drawing, than setting the L reset level. Thus it may be said that the H level is the more appropriate reset level.

A line $L2_L$ and a line $L2_H$ denote the relations between reset level and convergence time at a temperature of 10t° C. (ten times as high as t° C.). In a case where the temperature is 10t° C., setting the H reset level results in a convergence time shorter by time D2, as indicated by a bidirectional arrow in the drawing, than setting the L reset level. Thus it may be said that the H level is the more appropriate reset level.

Similarly, a line $L3_L$ and a line $L3_H$ denote the relations between reset level and convergence time at a temperature of 100t° C. (one hundred times as high as t° C.), and a line $L4_L$ and a line $L4_H$ denote the relations between reset level and convergence time at a temperature of 1000t° C. (one thousand times as high as t° C.). At these temperatures, either the H level or the L level is an optimum reset level resulting in the shorter convergence time.

As described above, in each pixel of the common logarithmic image sensor in solar cell mode, there occur different optimum reset levels at different temperatures due to the varying black level. Thus if an inappropriate reset level is set, the time required for the reset level to converge from the start of exposure (i.e., period of transition to logarithmic response) is prolonged. As a result, the period of transition to logarithmic response may exceed the exposure time. In such a case, the signal starts to be read before the period of transition to logarithmic response is completed. This leads to no logarithmic response being made in the low light intensity region, causing the S/N ratio to worsen.

To recap the above description, temperature-induced changes in characteristics present each pixel of the common logarithmic image sensor in solar cell mode with the following problems:

Specifically, first of all, because the black level is dependent on temperature, the output signal is overlaid with the temperature-dependent offset component. To obtain the correct output signal thus requires removing the offset component.

Second, with the black level in transition, there are different appropriate reset levels at different temperatures. Thus if an inappropriate reset level is set, the period of transition to logarithmic response may be prolonged. This leads to no logarithmic response being made in the low light intensity region, causing the S/N ratio to worsen. It follows that an appropriate reset level is required to be set at each different temperature.

In solving the above problems, the technology of the present disclosure (present technology) proposes a logarithmic image sensor (solid-state imaging apparatus) in solar cell mode that provides an appropriate output signal irrespective of temperature-induced changes in characteristics. A solid-state imaging apparatus configured to solve the problems discussed above is explained below.

Figure 4:
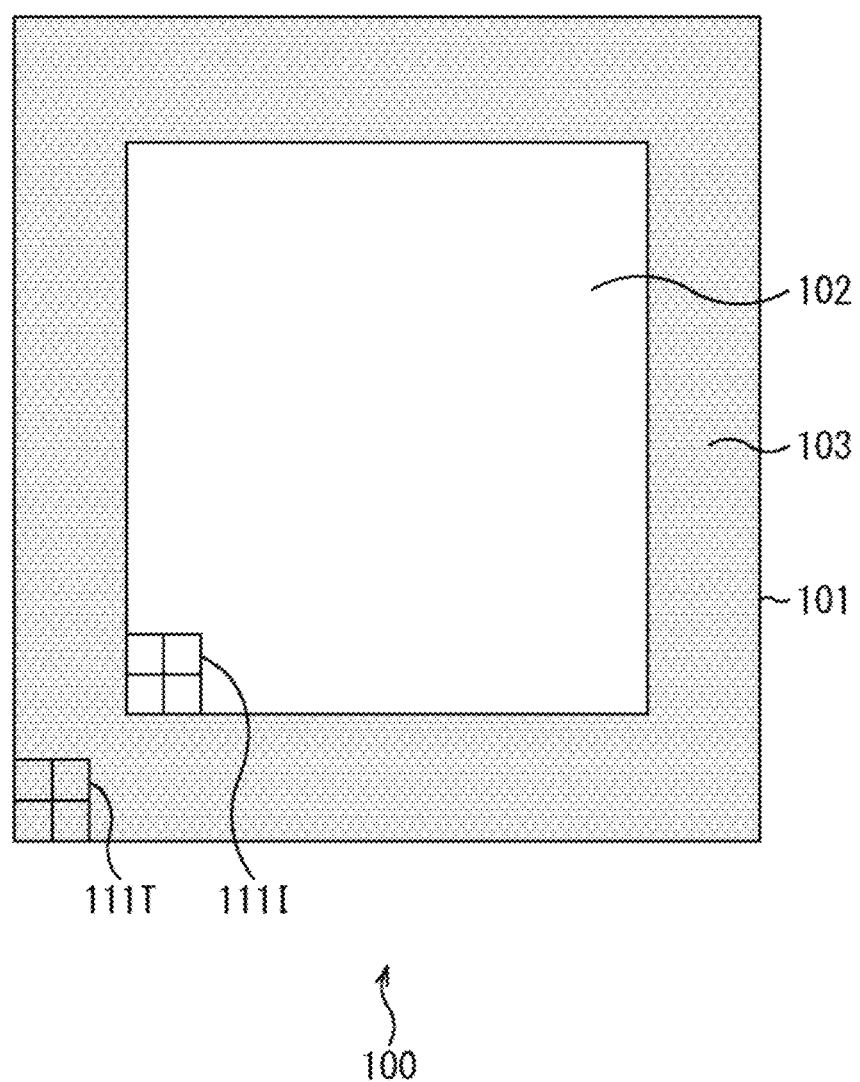
FIG. 4 is a top view depicting a configuration example of a solid-state imaging apparatus to which the technology of the present disclosure is applied.
Figure 5:
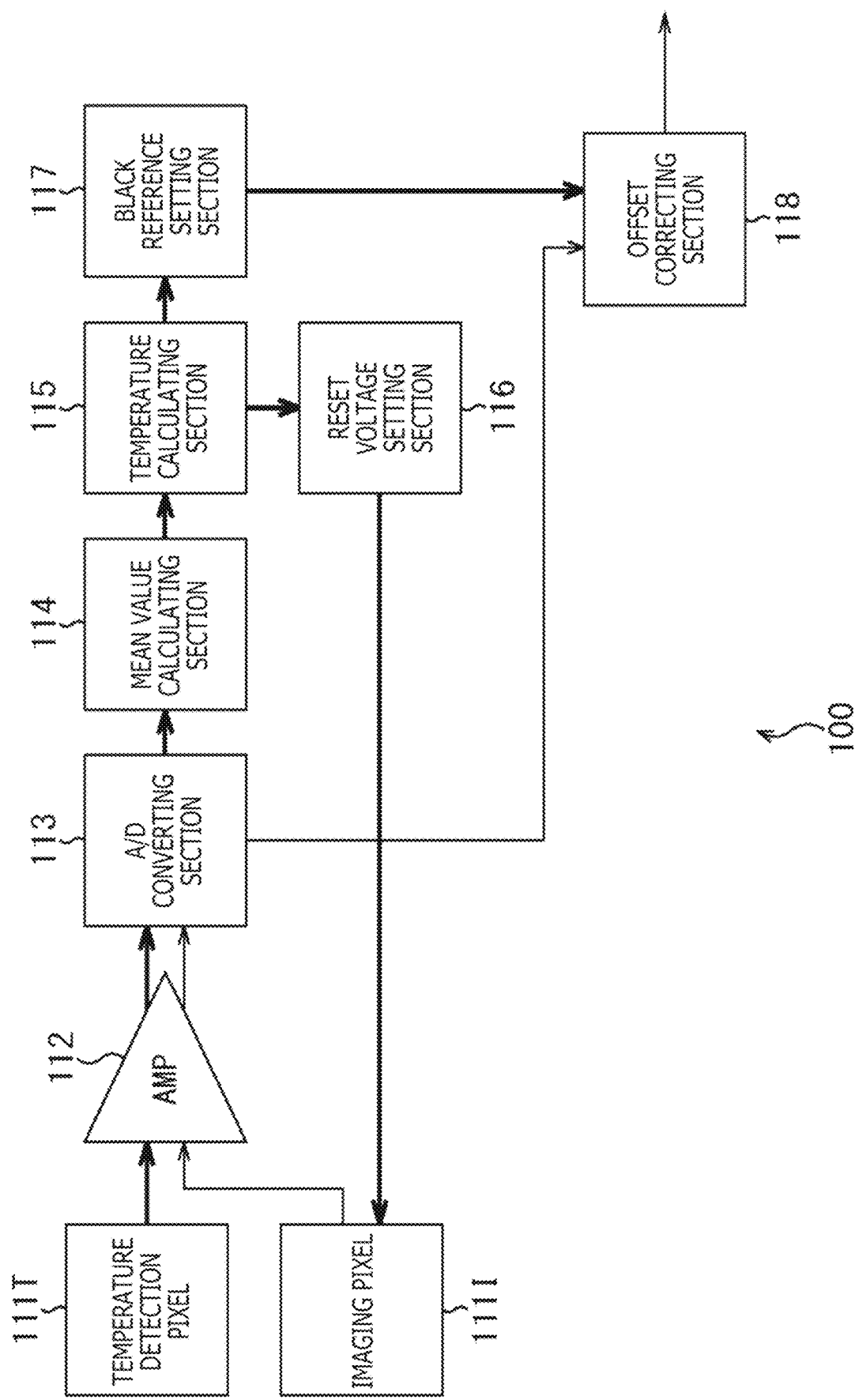
FIG. 5 is a block diagram depicting another configuration example of the solid-state imaging apparatus to which the technology of the present disclosure is applied.

2. Configuration Example of the Solid-State Imaging Apparatus to which the Technology of the Present Disclosure is Applied Configuration Example of the Solid-State Imaging Apparatus Explained below with reference to FIGS. 4 and 5 is a configuration example of a solid-state imaging apparatus to which the technology of the present disclosure is applied. FIG. 4 is a top view of a solid-state imaging apparatus 100 (its pixel array section) as viewed from the side of light incidence.

In FIG. 4, the solid-state imaging apparatus 100 is a logarithmic image sensor in solar cell mode that is configured to output a signal obtained from logarithmic compression of a photoelectric current, such as a CMOS (Complementary Metal Oxide Semiconductor) image sensor.

In the solid-state imaging apparatus 100, a pixel array section 101 has a portion of its light incident side shaded in a frame pattern by a member such as a light blocking film capable of blocking incident light. In other words, in the pixel array section 101, the region on the light incident side is divided into an aperture region 102 through which light enters and a light blocking region 103 that blocks light.

In the pixel array section 101, imaging pixels 111I and temperature detection pixels 111T are arranged in a matrix pattern. Multiple imaging patterns 111I are arranged in the aperture region 102 at the center. In the surrounding light blocking region 103, one or multiple temperature detection pixels 111T are arranged. The light blocking region 103 has black level detection pixels arranged for detecting the black level for use by a downstream signal processing circuit.

The aperture region 102 has filters installed therein on its light incident side. This allows multiple imaging pixels 111I to be arranged two-dimensionally in a Bayer array, for example. Here, the Bayer array refers to an array pattern where green (G) pixels representing green are arranged in a checkered pattern, the rest of the array having red (R) pixels and blue (B) pixels arranged alternately every other column.

The imaging pixels 111I include a photodiode and a pixel transistor each, the photodiode operating as an open circuit similar to a solar cell. As such, the imaging pixels 111I generate output signals (color component signals) with logarithmic characteristics. Note that a detailed configuration of the imaging pixel will be discussed later with reference to FIG. 6.

Meanwhile, in the light blocking region 103, a desired number of temperature detection pixels 111T may be arranged where desired. In other words, the temperature detection pixels 111T may be arranged anywhere in the light blocking region 103 as long as they are inside that region 103. For example, only one temperature detection pixel 111T may be provided. Alternatively, multiple temperature detection pixels 111T may be arranged in rows (in one or multiple lines) or in columns (in one or multiple columns).

Still, it is preferred that as many temperature detection pixels 111T in the light blocking region 103 as possible be arranged as close to the imaging pixels 111I in the aperture region 102 as possible. The reason for this is that the arrangement suppresses variations in detection results and permits acquisition of more accurate temperature information.

The temperature detection pixels 111T generate a temperature detection signal along with a photodiode operating as an open circuit similar to a solar cell and a pixel transistor each, the photodiode being impressed externally with a constant current through a capacitor connected therewith. A detailed configuration of the temperature detection pixel 111T will be discussed later with reference to FIG. 7.

FIG. 5 is a block diagram depicting a detailed configuration of a signal processing circuit disposed downstream of the imaging pixel 111I and temperature detection pixels 111T illustrated in FIG. 4.

In other words, the solid-state imaging apparatus 100 includes a signal amplifying section 112, an A/D converting section 113, a mean value calculating section 114, a temperature calculating section 115, a reset voltage setting section 116, a black reference setting section 117, and an offset correcting section 118 in addition to the pixel array section 101 (FIG. 4) in which the imaging pixels 111I and temperature detection pixels 111T are arranged in a matrix pattern.

It is to be noted that, of the multiple pixels arranged in a matrix pattern in the pixel array section 101, one imaging pixel 111I and one temperature detection pixel 111T are depicted in FIG. 5. Also in FIG. 5, normal lines denote the signal flows of the color component signal emanating from the imaging pixel 111I, and thick lines indicate the signal flows of the temperature detection signal from the temperature detection pixel 111T.

The color component signal obtained by the imaging pixel 111I is supplied to the signal amplifying section 112. The temperature detection signal acquired by the temperature detection pixel 111T is also supplied to the signal amplifying section 112.

The signal amplifying section 112 amplifies the color component signal coming from the imaging pixel 111I and supplies the amplified signal to the A/D converting section 113. The signal amplifying section 112 also amplifies the temperature detection signal from the temperature detection pixel 111T before supplying the amplified signal to the A/D converting section 113.

The A/D converting section 113 converts the color component signal coming from the signal amplifying section 112 from analog to digital form, and supplies the digital signal to the offset correcting section 118. Further, the A/D converting section 113 converts the temperature detection signal coming from the signal amplifying section 112 from analog to digital form, and supplies the digital signal to the mean value calculating section 114.

The example here indicates, it is to be noted, that multiple temperature detection pixels 111T are arranged in the light blocking region 103 of the pixel array section 101 (FIG. 4). The mean value calculating section 114 thus receives input of temperature detection signals from multiple temperature detection pixels 111T, each of the signals having been amplified before being converted from analog to digital form.

The mean value calculating section 114 calculates a mean value of the values reflecting the multiple temperature detection signals input thereto. The mean value calculating section 114 supplies the resulting mean value to the temperature calculating section 115.

The temperature calculating section 115 calculates the temperature in the vicinity of the temperature detection pixels 111T arranged in the light blocking region 103, on the basis of the mean value from the mean value calculating section 114. The temperature calculating section 115 supplies the calculated temperature information to the reset voltage setting section 116 and to the black reference setting section 117.

The reset voltage setting section 116 reduces (converts) to an appropriate reset level the reset level to be set to the photodiode of the imaging pixel 111I (i.e., photodiode 151 in FIG. 6) on the basis of the temperature information from the temperature calculating section 115. The reset voltage setting section 116 then sets (by feedback) the appropriate reset level obtained through conversion as the reset level for the photodiode (photodiode 151 in FIG. 6) of the imaging pixel 111I.

The black reference setting section 117 calculates an offset amount by reducing (converting) to an appropriate black level the black level obtained from the black level detection pixel on the basis of the temperature information from the temperature calculating section 115. The black reference setting section 117 then sets the offset amount obtained through conversion to the offset correcting section 118.

The offset correcting section 118 receives input of the signal from the A/D converting section 113 and of the offset amount from the black reference setting section 117. On the basis of the offset amount set by the black reference setting section 117, the offset correcting section 118 corrects the signal coming from the imaging pixel 111I as the color component signal having been amplified and converted from analog to digital form. An output signal obtained through correction using the offset amount is output to a downstream image processing circuit (not depicted).

In the solid-state imaging apparatus 100 configured as described above, the output of the temperature detection pixel 111T is converted from analog to digital form similar to the output of the imaging pixel 111I. Where there are multiple temperature detection pixels 111T, a mean value of their outputs is calculated. Further, the temperature calculating section 115 calculates the temperature information. The black reference setting section 117 calculates the offset amount by converting the temperature information to the black level.

Meanwhile, the reset voltage setting section 116 converts the temperature information to an appropriate reset level, which is fed back as the reset level to the imaging pixel 111I (i.e., to its photodiode). In this state, the imaging pixel 111I is read out to generate its output signal (color component signal), which is corrected by the offset correcting section 118 using the previously calculated offset amount. Thus, the output signal (color component signal) obtained at the reset level corresponding to the temperature is corrected by the offset amount.

Circuit Diagram of the Imaging Pixel

Figure 6:
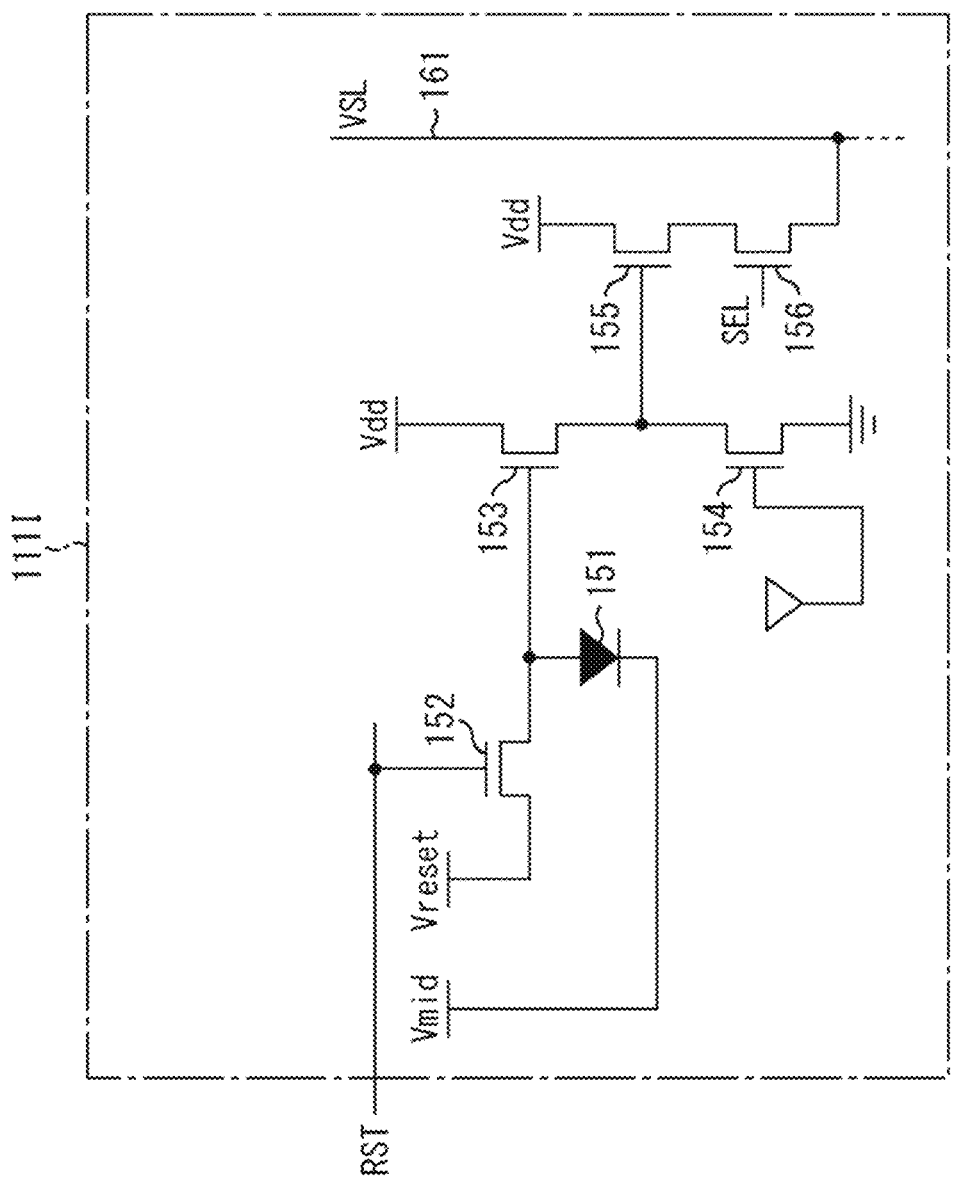
FIG. 6 is a circuit diagram depicting a configuration example of an imaging pixel.

FIG. 6 is a circuit diagram depicting a configuration example of the imaging pixel 111I in FIG. 4 or FIG. 5.

In FIG. 6, the imaging pixel 111I includes a photodiode 151, a reset transistor 152, an amplification transistor 153, a bias transistor 154, an amplification transistor 155, and a selection transistor 156.

The photodiode 151 is a photoelectric conversion section that includes an n-type semiconductor region and a p-type semiconductor region. The cathode electrode of the photodiode 151 is connected with an intermediate potential Vmid, and the anode electrode of the photodiode 151 is connected with the source of the reset transistor 152 and with the gate of the amplification transistor 153.

The drain of the reset transistor 152 is connected with a reset potential Vreset, and the source of the reset transistor 152 is connected with the photodiode 151 and with the gate of the amplification transistor 153. Incidentally, the reset potential Vreset corresponds to the above-mentioned reset level (reset potential). The gate electrode of the reset transistor 152 is impressed with a reset signal (RST). When the reset signal (RST) is in the active state, the reset gate of the reset transistor 152 conducts, which resets the potential of the photodiode 151. It is to be noted, however, that the reset level (reset potential) of the photodiode 151 is set by the reset voltage setting section 116 (FIG. 5).

The drain of the amplification transistor 153 is connected with a power supply voltage Vdd, and the source of the amplification transistor 153 is connected with the drain of the bias transistor 154 and with the gate of the amplification transistor 155. The gate of the amplification transistor 153 is connected with the photodiode 151 and with the drain of the reset transistor 152. The gate electrode of the amplification transistor 153 is impressed with the signal from the photodiode 151. The impressed signal is amplified before being output to the amplification transistor 155.

The drain of the bias transistor 154 is connected with the source of the amplification transistor 153 and with the gate of the amplification transistor 155. The source of the bias transistor 154 is grounded. The gate electrode of the bias transistor 154 is impressed with a predetermined signal, which sets a reference current.

The drain of the amplification transistor 155 is connected with the power supply voltage Vdd, and the source of the amplification transistor 155 is connected with the drain of the selection transistor 156. The gate of the amplification transistor 155 is connected with the source of the amplification transistor 153 and with the drain of the bias transistor 154. The gate electrode of the amplification transistor 155 is impressed with the signal from the photodiode 151. The impressed signal is amplified before being output to the selection transistor 156.

The drain of the selection transistor 156 is connected with the source of the amplification transistor 155, and the source of the selection transistor 156 is connected with a vertical signal line (VSL) 161. Further, the gate electrode of the selection transistor 156 is impressed with a selection signal (SEL). When the selection signal (SEL) is in the active state, the selection transistor 156 conducts, which puts the imaging pixel 111I in the elected state. In this manner, the signal output from the amplification transistor 155 is output onto the vertical signal line 161 via the selection transistor 156.

Incidentally, the imaging pixel 111I in FIG. 6 is a pixel of the logarithmic image sensor in solar cell mode, representing one of the multiple pixels arranged in a matrix pattern in the aperture region 102 of the pixel array section 101. The multiple imaging pixels 111I arranged in the aperture region 102 of the pixel array section 101 are provided with the vertical signal line 161 that supplies to the downstream signal processing circuit (FIG. 5) a pixel drive signal (not depicted) for supplying a pulse signal to drive the pixels in units of rows and the pixel signal (color component signal) generated by each pixel in units of columns.

In the imaging pixel 111I configured as descried above, the potential difference generated by the current flowing in the forward direction of the PN junction, i.e., the relation of the voltage being proportional to the logarithm of the current, is used to replace the forward current with a photoelectric current generated through photoelectric conversion so as to monitor the forward voltage of the PN junction. The monitoring permits acquisition of the signal through logarithmic compression of the photoelectric current.

Circuit Diagram of the Temperature Detection Pixel

Figure 7:
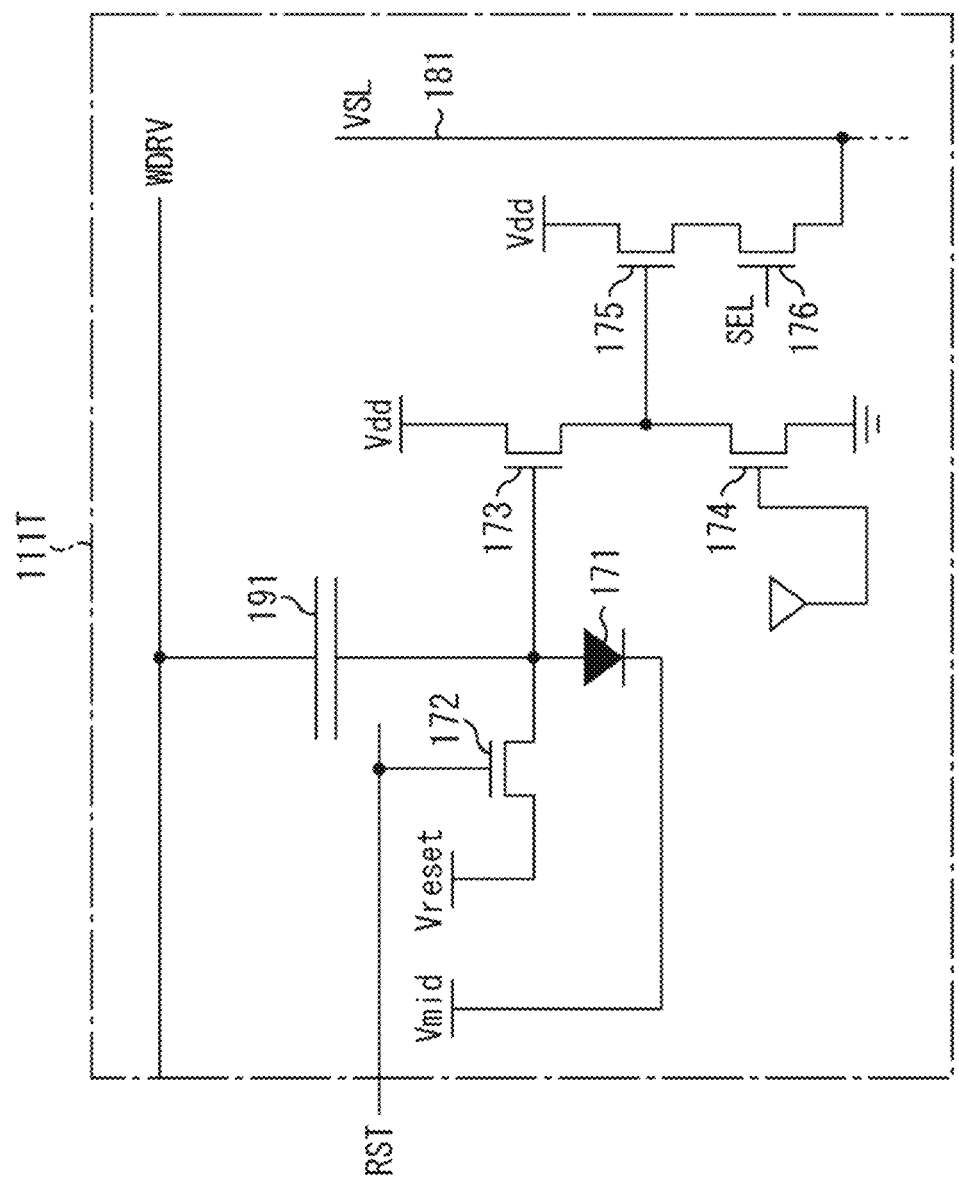
FIG. 7 is a circuit diagram depicting a configuration example of a temperature detection pixel.

FIG. 7 is a circuit diagram depicting a configuration example of the temperature detection pixel 111T in FIG. 4 or FIG. 5.

In FIG. 7, the temperature detection pixel 111T includes a photodiode 171, a reset transistor 172, an amplification transistor 173, a bias transistor 174, an amplification transistor 175, a selection transistor 176, and a capacitor 191.

In the temperature detection pixel 111T in FIG. 7, the components ranging from the photodiode 171 to the selection transistor 176 are configured similar to the photodiode 151 through the selection transistor 156 of the imaging pixel 111I in FIG. 6. In other words, the temperature detection pixel 111T in FIG. 7 differs from the imaging pixel 111I in FIG. 6 in that the photodiode 171 is connected with the capacitor 191.

One electrode of the capacitor 191 is connected with the photodiode 171, with the source of the reset transistor 172, and with the gate of the amplification transistor 173. The other electrode of the capacitor 191 is connected with a drive wire WDRV through which a constant current from a constant current source flows. In this configuration, the photodiode 171 connected with the capacitor is impressed with the constant current therethrough from the outside.

Here, the temperature detection pixel 111T is arranged in the light blocking region 103 that blocks incident light. Thus the constant current applied to the photodiode 171 via the capacitor 191 corresponds to the photoelectric current for use in reading the signal voltage output upon incidence of light. In addition, because the signal voltage varies with temperature, the downstream temperature calculating section 115 (FIG. 5) can acquire the temperature information reflecting the signal voltage from the output of the temperature detection pixel 111T (i.e., temperature detection signal).

In other words, given the constant current corresponding to the photoelectric current, if the output (temperature detection signal) of the temperature detection pixel 111T in the light blocking region 103 is varied, the variation in the output reflects the variation in temperature. This allows the temperature calculating section 115 to obtain the temperature information corresponding to the variation.

Method of Driving the Temperature Detection Pixel

Figure 8:
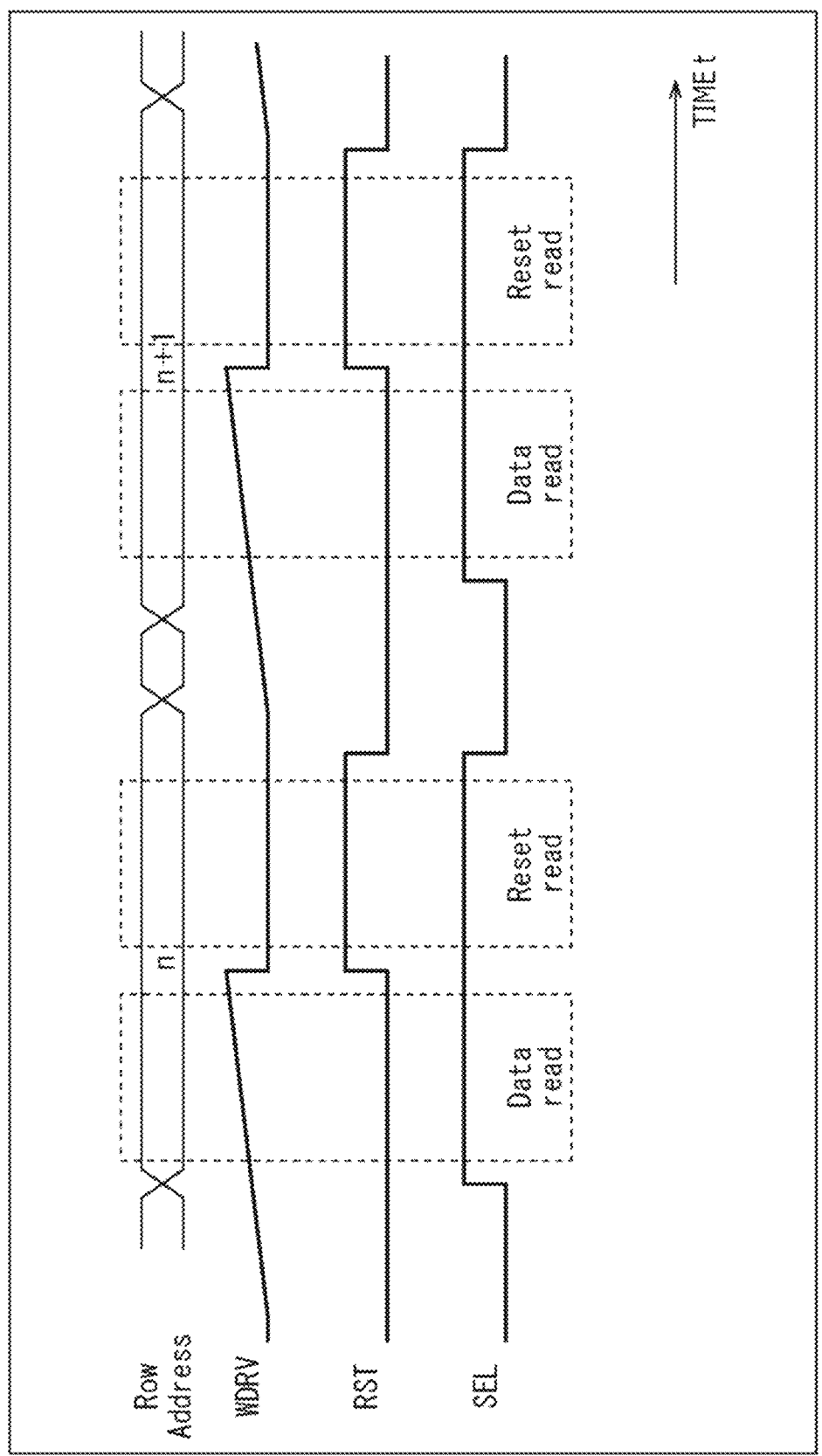
FIG. 8 is a timing chart of assistance in explaining a method of driving a temperature correction pixel.

FIG. 8 is a timing chart of assistance in explaining the method of driving the temperature detection pixel 111T in FIG. 7.

The timing chart in FIG. 8 illustrates, in chronological order, the level of the constant current on the drive wire WDRV, the level of the reset signal (RST) applied to the gate electrode of the reset transistor 172, and the level of the selection signal (SEL) applied to the gate electrode of the selection transistor 176 in the temperature detection pixel 111T (FIG. 7), along with a row address signal (Row Address).

As depicted in FIG. 8, the selection signal (SEL) when brought High causes the selection transistor 176 to read the signal level (S) of the photodiode 171 ("Data read" in the drawing). Thereafter, the reset signal (RST) brought High resets the photodiode 171, which allows the noise level (N) to be read out ("Reset read" in the drawing).

Here, at the "Data read" timing of reading the signal level (S), a sweep is performed on the drive wire WDRV. This causes the photodiode 171 to be impressed with a constant current that constitutes a ramp wave. The constant current applied to the photodiode 171 corresponds to a photoelectric current, which permits reading of the signal voltage output upon incidence of light.

In the temperature detection pixel 111T configured as described above, the photodiode 171 is connected with the capacitor through which the constant current is applied from the outside. This causes the output (temperature detection signal) of the temperature detection pixel 111T to vary depending on the temperature, allowing the downstream temperature calculating section 115 (FIG. 5) to acquire the temperature information.

As described above, in the pixel array section 101 of the solid-state imaging apparatus 100, the imaging pixel 111I in the aperture region 102 at the center is surrounded by the light blocking region 103 that includes the temperature detection pixel 111T. The temperature information obtained from the temperature detection signal coming from the temperature detection pixel 111T provides the basis for correcting the color component signal output from the imaging pixel 111I.

At this point, in the solid-state imaging apparatus 100, the photodiode 151 of the imaging pixel 111I is reset with the appropriate reset level that is set by the reset voltage setting section 116 in a manner reflecting the temperature information. Further, the black reference setting section 117 sets an appropriate black level corresponding to the temperature information. The offset correcting section 118 corrects the color component signal obtained with the appropriate reset level being set, using the offset amount acquired from the appropriate black level.

Heretofore, the pixels of the common logarithmic image sensor in solar cell mode have each been subject to temperature-induced changes in characteristics. The problem is that with the black level being dependent on temperature, the output signal is overlaid with the temperature-dependent offset component. According to the technology of the present disclosure, by contrast, the offset correcting section 118 corrects the color component signal using the offset amount obtained from the appropriate black level. This eliminates the temperature-dependent offset component, thereby providing the correct output signal.

When the black level is temperature-dependent, transitions of the black level cause the appropriate reset level for the photodiode 151 in the imaging pixel 111I to vary with temperature. Thus the problem is that setting an inappropriate reset level prolongs the period of transition to logarithmic response. With no logarithmic response made in the low light intensity region, the S/N ratio worsens. According to the technology of the present technology, by contrast, the reset voltage setting section 116 sets the reset level corresponding to the temperature information. Because the appropriate reset level (e.g., a reset level that shortens the period of transition to logarithmic response) is set for varying temperatures, the period of transition to logarithmic response is kept from being prolonged, which suppresses the worsening of the S/N ratio.

In the above-described example of FIG. 2, both the Dark signal and the Bright signal on the VSL include the offset component reflecting the temperature. According to the technology of the present disclosure, the two signals are each corrected using the offset amount.

3. Variations

Explained in the foregoing paragraphs is the configuration in which the A/D converting section 113 (FIG. 5) converts the temperature detection signal coming from the temperature detection pixel 111T (FIG. 5) from analog to digital form so as to process the digital signal. Alternatively, the temperature detection signal may be processed in the form of an analog signal without being converted to a digital signal. Furthermore, the output signal (color component signal) from the imaging pixel 111I (FIG. 5) may be converted from analog to digital form not upstream of the offset correcting section 118 (FIG. 5) but after the offset correction by the offset correcting section 118.

It is also explained above that the temperature detection pixel 111T is configured to have the capacitor connected with the photodiode 171. However, this configuration is only an example. Some other suitable configuration may be employed as long as it permits acquisition of the temperature information.

It is also explained above that the mean value calculating section 114 (FIG. 5) calculates the mean value of the temperature detection signals obtained from the multiple temperature detection pixels 111T (FIG. 5). Alternatively, some suitable statistical value other than the mean value (e.g., median value, mode value, maximum value, or minimum value) may be calculated and utilized.

Depending on the arrangement of the temperature detection pixels 111T in the light block region 103, the temperature detection signals from the multiple temperature detection pixels 111T may be corrected for each column without being averaged. As another alternative, for example, in the case where only one temperature detection pixel 111T is disposed in the light blocking region 103, there is no need to calculate a mean value so that there is no need for the mean value calculating section 114 (FIG. 5).

It is further explained above that the black reference setting section 117 calculates the offset amount. Alternatively, the offset amount may be calculated by the offset correcting section 118.

Incidentally, given the relations with respect to conversion time depicted, for example, in FIG. 3 regarding the solid-state imaging apparatus 100, when the temperature calculating section 115 calculates the t° C., the reset voltage setting section 116 may set the H level, rather than the L level, as the reset level (reset potential) for the photodiode 151, the H level being the level at which the convergence time turns out to be the shorter (i.e., the period of transition to logarithmic response is the shorter).

It is to be noted, however, that although a binary comparison is made between the H level and the L level in the example of FIG. 3, the selection is not limited to between the H level and the L level. Alternatively, an optimum reset potential may be selected from the reset potentials that can be set by the system, and the selected reset potential may be set as the reset level (reset potential) for the photodiode 151. In other words, the number of reset potentials that may be set here is dependent on the system.

Figure 9:
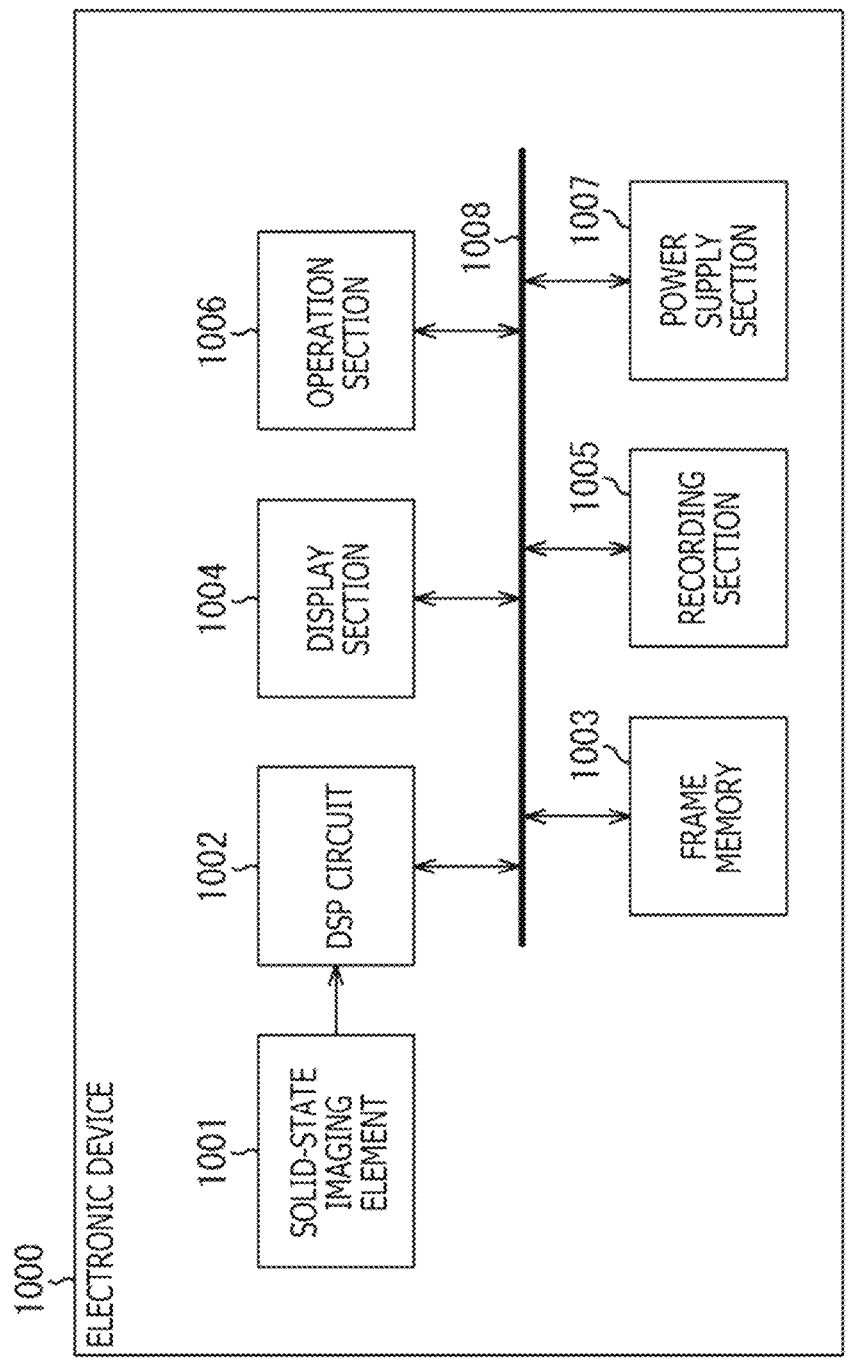
FIG. 9 is a block diagram depicting a configuration example of an electronic device that includes the solid-state imaging apparatus to which the technology of the present disclosure is applied.

4. Configuration Example of an Electronic Device Including a Solid-State Imaging Apparatus to which the Technology of the Present Disclosure is Applied FIG. 9 is a block diagram of an electronic device 1000 that has the solid-state imaging apparatus to which the technology of the present disclosure is applied.

The electronic device 1000 may be an imaging apparatus such as a digital still camera or a video camera, or a mobile terminal apparatus such as a smartphone or a tablet type terminal, for example.

The electronic device 1000 includes a solid-state imaging element 1001, a DSP circuit 1002, a frame memory 1003, a display section 1004, a recording section 1005, an operation section 1006, and a power supply section 1007. In the electronic device 1000, the DSP circuit 1002, frame memory 1003, display section 1004, recording section 1005, operation section 1006, and power supply section 1007 are interconnected via a bus line 1008.

The slid-state imaging element 1001 corresponds to the above-described solid-state imaging apparatus 100 and is configured as depicted in FIG. 4 or FIG. 5. In other words, in the pixel array section 101 of the solid-state imaging apparatus 100, multiple imaging pixels 111I are arranged in the aperture region 102 and one or multiple temperature detection pixels 111T are arranged in the light blocking region 103.

The DSP circuit 1002 is a camera signal processing circuit that processes the signal supplied from the solid-state imaging element 1001. The DSP circuit 1002 outputs image data obtained by processing the signal from the solid-state imaging element 1001. The frame memory 1003 temporarily holds, in units of frames, the image data processed by the DSP circuit 1002.

The display section 1004 is a panel type display apparatus such as a liquid crystal display panel or an organic EL (Electro Luminescence) panel, for example. As such, the display section 1004 displays video or still images captured by the solid-state imaging element 1001. The recording section 1005 records video data or still image data captured by the solid-state imaging element 1001 to recording media such as a semiconductor memory or a hard disk.

The operation section 1006 outputs, in accordance with a user's operations, operation commands regarding diverse functions provided by the electronic device 1000. The power supply section 1007 provides, as needed, various power sources for operating the DSP circuit 1002, frame memory 1003, display section 1004, recording section 1005, and operation section 1006.

The electronic device 1000 is configured as described above. The technology of the present disclosure is applied to the solid-state imaging element 1001 as explained above. Specifically, the solid-state imaging apparatus 100 in FIG. 5 may be used as the solid-state imaging element 1001. Applying the technology of the present disclosure to the solid-state imaging element 1001 makes it possible, for example, to obtain an appropriate output signal irrespective of temperature-induced changes in characteristics. This permits acquisition of captured images of higher quality in an environment where the temperature can vary.

Figure 10:
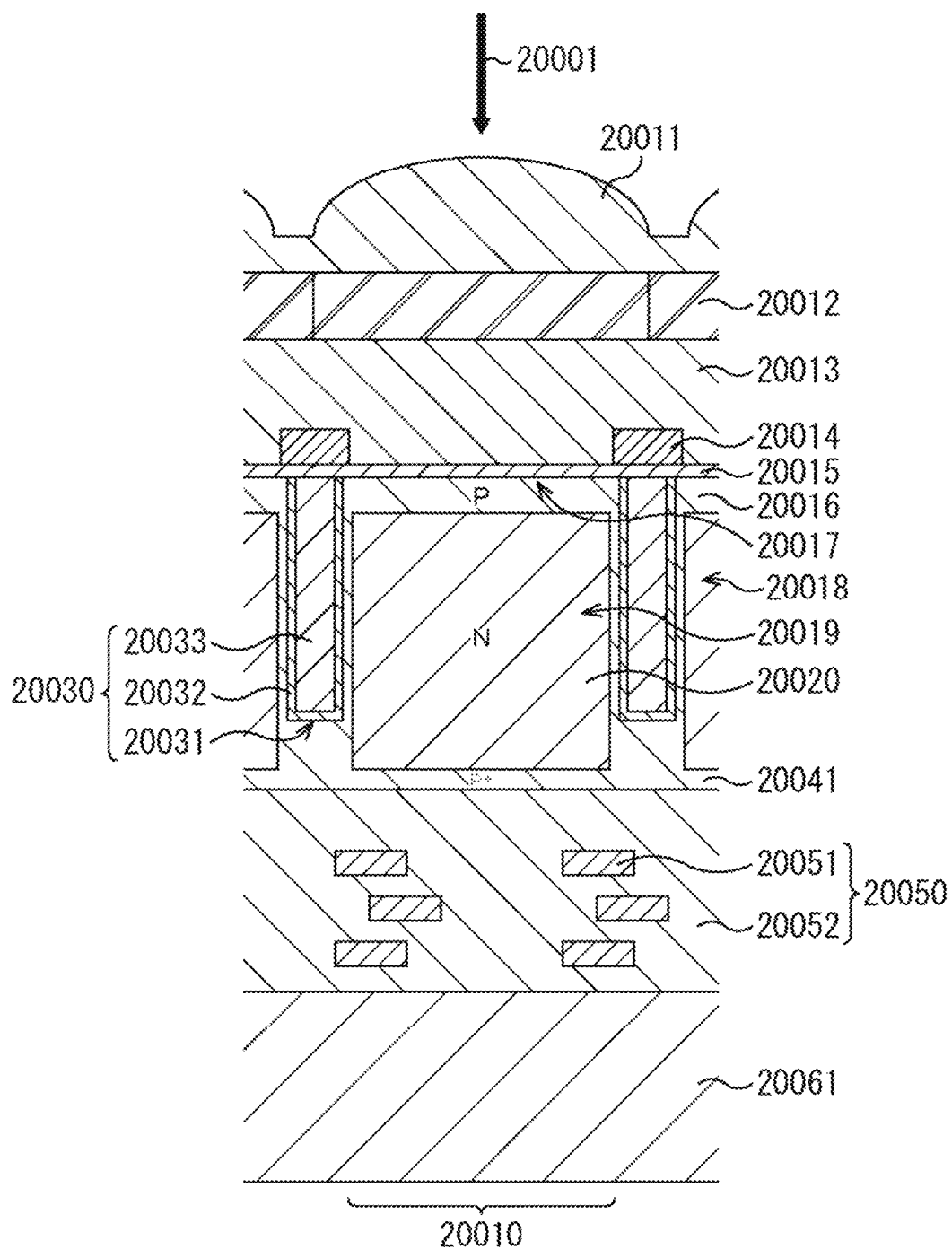
FIG. 10 is a cross-sectional diagram depicting a configuration example of a solid-state imaging apparatus to which the technology of the present disclosure can be applied.

5. Cross-Sectional Configuration Example of a Solid-State Imaging Apparatus to Which the Technology of the Present Disclosure can be Applied FIG. 10 is a cross-sectional diagram of a solid-state imaging apparatus to which the technology of the present disclosure can be applied.

In the solid-state imaging apparatus, a photodiode (PD) 20019 constituting a pixel 20010 receives incident light 20001 that enters from the back side (top side in the drawing) of a semiconductor substrate 20018. Provided above the PD 20019 are a planarizing film 20013, a color filter (CF) 20012, and a microlens 20011. The PD 20019 has a light receiving surface 20017 that receives the incident light 20001 sequentially passing through each of the above-mentioned components, the PD 20019 subjecting the received incident light 20001 to photoelectric conversion.

For example, the PD 20019 has an n-type semiconductor region 20020 formed as a charge storage region that stores electrical charges (electrons). In the PD 20019, the n-type semiconductor region 20020 is located inside p-type semiconductor regions 20016 and 20041 of the semiconductor substrate 20018. In the n-type semiconductor region 20020, provided on the surface side (underside) of the semiconductor substrate 20018 is the p-type semiconductor region 20041 with a higher concentration of impurities than on the back side (top side). In other words, the PD 20019 is configured as an HAD (Hole-Accumulation Diode). On the top side and the underside of the n-type semiconductor region 20020, the p-type semiconductor regions 20016 and 20041 are formed respectively to suppress the generation of a dark current.

Inside the semiconductor substrate 20018 is a pixel separating section 20030 that electrically separates multiple pixels 20010. The PD 20019 is located in a region partitioned by the pixel separating section 20030. In a case where the solid-state imaging apparatus is viewed from the top side in the drawing, the pixel separating section 20030 is interposed between the multiple pixels 20010 to form a grid-like pattern.

The PD 20019 is located in a grid region partitioned by the pixel separating section 20030.

The anode of each PD 20019 is grounded. In the solid-state imaging apparatus, the signal charge (e.g., electrons) accumulated in the PD 20019 is read via a transfer Tr (MOS FET) or the like, not depicted, and output as an electrical signal onto a vertical signal line (VSL), not depicted.

A wiring layer 20050 is provided on that opposite surface (underside) of the semiconductor substrate 20018 which is opposite to the back side (top side) where each of the components such as a light blocking film 20014, the CF 20012, and the microlens 20011 are located.

The wiring layer 20050 includes wiring 20051 and an insulating layer 20052. In the insulating layer 20052, the wiring 20051 is formed so as to connect electrically with each element. The wiring layer 20050 constitutes a so-called multilayer wiring layer in which an interlayer dielectric film making up the insulating layer 20052 and the wiring 20051 are alternately layered multiple times. Here, the wiring 20051 is constituted by wires connected with Trs for reading the electrical charges from the PD 20019 of the transfer Tr or the like and by wires such as VSLs, the wires being layered with the insulating layer 20052 interposed therebetween.

A support substrate 20061 is provided on that side of the wiring layer 20050 which is opposite to the side where the PD 20019 is located. For example, a silicon semiconductor that is hundreds of μm thick constitutes the support substrate 20061.

The light blocking film 20014 is provided on the back side (top side in the drawing) of the semiconductor substrate 20018.

The light blocking film 20014 is configured to partially block the incident light 20001 that enters from above the semiconductor substrate 20018 and continues downward.

The light blocking film 20014 is provided above the pixel separating section 20030 located inside the semiconductor substrate 20018. Here, the light blocking film 20014 is configured in such a manner as to protrude through an insulating film 20015 such as a silicon oxide film onto the back side (top side) of the semiconductor substrate 20018. On the upper side of the PD 20019 in the semiconductor substrate 20018, by contrast, the light blocking film 20014 is not provided so that the incident light 20001 enters the PD 20019 through an aperture.

That is, in a case where the solid-state imaging apparatus is viewed from the top side, the light blocking film 20014 forms a plane in a grid-like pattern. The apertures are thus formed that allow the incident light 20001 to continue toward the light receiving surface 20017.

The light blocking film 20014 includes a light blocking material that blocks light. For example, the light blocking film 20014 is formed by alternately layering a titanium (Ti) film and a tungsten (W) film. Alternatively, the light blocking film 20014 may be formed by alternately layering a titanium nitride (TiN) film and a tungsten (W) film. The light blocking film 20014 may be covered with nitride (N), for example.

The light blocking film 20014 is covered with the planarizing film 20013. The planarizing film 20013 is formed by use of an insulating material that lets light pass through.

The pixel separating section 20030 includes a groove section 20031, a fixed charge film 20032, and an insulating film 20033.

On the back side (top side) of the semiconductor substrate 20018, the fixed charge film 20032 is formed to cover the groove section 20031 that partitions multiple pixels 20010.

Specifically, the fixed charge film 20032 is provided in a manner covering the internal surface of the groove section 20031 with a constant thickness, the groove section 20031 being formed on the back side (top side) of the semiconductor substrate 20018. In addition, the insulating film 20033 is provided to fill (pack) the inside of the groove 20031 covered with the fixed charge film 20032.

Here, the fixed charge film 20032 is formed by use of a high dielectric material that has negative fixed charges for suppressing the generation of a dark current from a positive charge (hole) storage region formed in an interface portion with the semiconductor substrate 20018. With the fixed charge film 20032 formed to carry negative fixed charges, the negative fixed charges apply an electric field to the interface with the semiconductor substrate 20018, thereby forming the positive charge (hole) storage region in the interface.

The fixed charge film 20032 may be formed using a hafnium oxide film (HfO2 film), for example. Alternatively, the fixed charge film 20032 may be formed to include at least one of such oxide elements as hafnium, zirconium, aluminum, tantalum, titanium, magnesium, yttrium, or lanthanoid.

The technology of the present disclosure can thus be applied to the solid-state imaging apparatus described above.

6. Configuration Examples of a Stacked-Type Solid-State Imaging Apparatus to which the Technology of the Present Disclosure can be Applied FIGS. 11A and 11B are schematic diagrams outlining configuration examples of a stacked-type solid-state imaging apparatus to which the technology of the present disclosure can be applied.

Figure 11A:
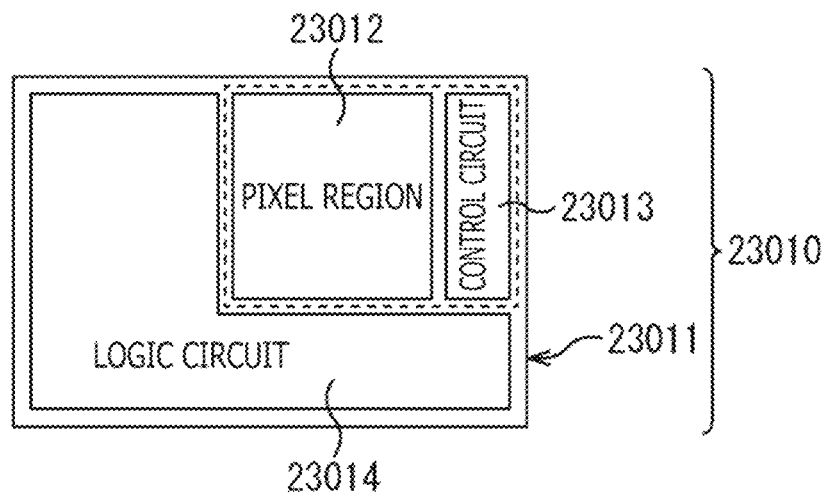
FIGS. 11A, 11B, and 11C are schematic diagrams outlining configuration examples of a stacked-type solid-state imaging apparatus to which the technology of the present disclosure can be applied.

FIG. 11A depicts a schematic configuration example of an unstacked-type solid-state imaging apparatus. A solid-state imaging apparatus 23010 has a single die (semiconductor substrate) 23011 as illustrated in FIG. 11A. The die 23011 carries a pixel region 23012 with pixels arrayed therein, a control circuit 23013 for performing controls including driving the pixels, and a logic circuit 23014 for processing signals.

Figure 11B:
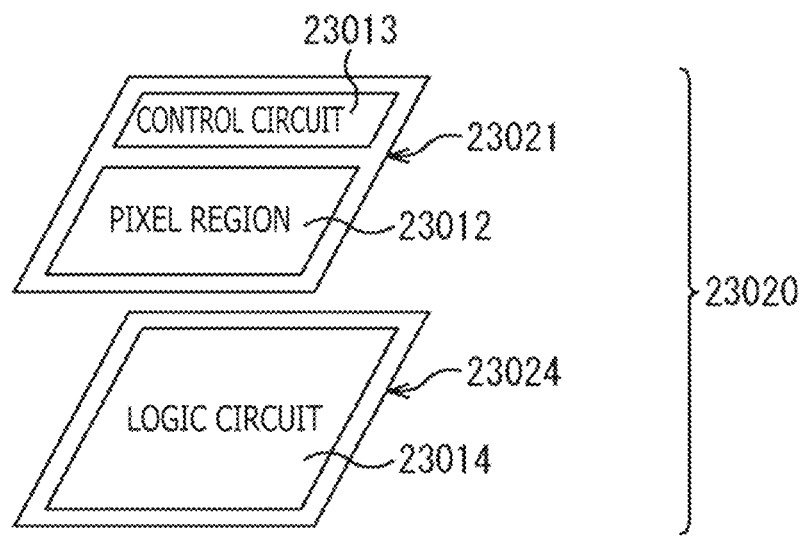
Figure 11C:
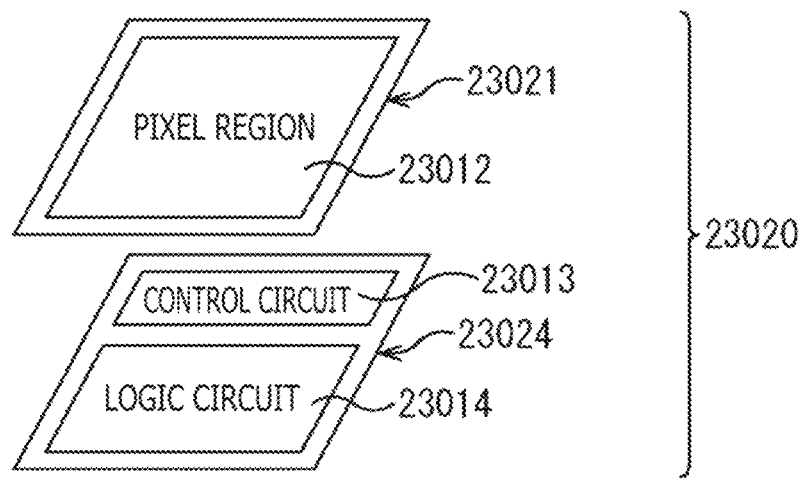

FIGS. 11B and 11C depict schematic configuration examples of a stacked-type solid-state imaging apparatus. A solid-state imaging apparatus 23020 has a sensor die 23021 and a logic die 23024 stacked one on top of the other and electrically interconnected to constitute a single semiconductor chip, as illustrated in FIGS. 11B and 11C.

In FIG. 11B, the sensor die 23021 carries the pixel region 23012 and the control circuit 23013. The logic die 23024 carries the logic circuit 23014 that includes a signal processing circuit for processing signals.

In FIG. 11C, the sensor die 23021 carries the pixel region 23012. The logic die 23024 carries the control circuit 23013 and the logic circuit 23014.

Figure 12:
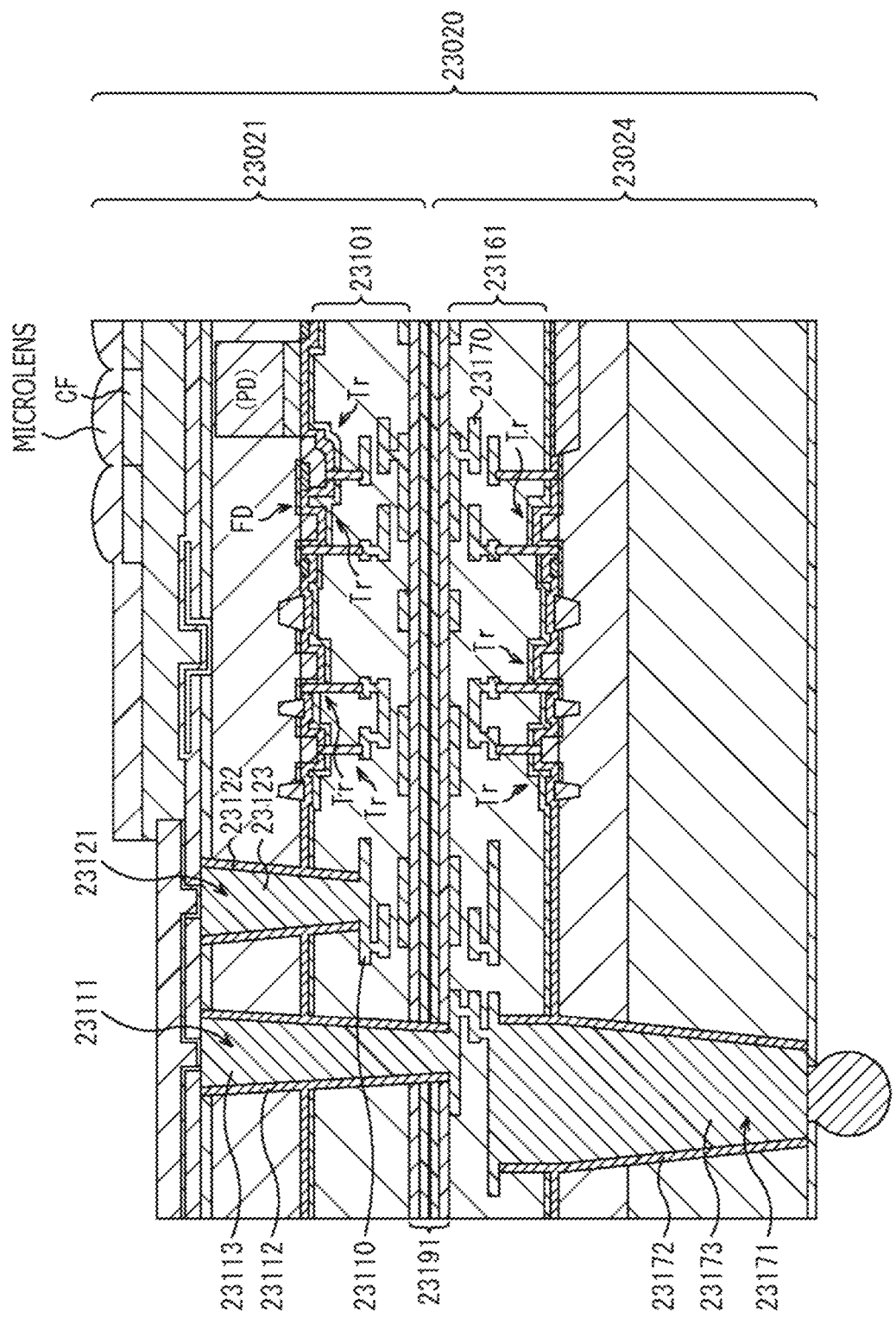
FIG. 12 is a cross-sectional diagram depicting a first configuration example of the stacked-type solid-state imaging apparatus.

FIG. 12 is a cross-sectional diagram depicting a first configuration example of the stacked-type solid-state imaging apparatus 23020.

Formed in the sensor die 23021 are PDs (photodiodes) forming pixels that make up the pixel region 23012, FD (floating diffusion) regions, Trs (MOS FETs), transistors that constitute the control circuit 23013, and the like. Also formed in the sensor die 23021 is a wiring layer 23101 that has multiple layers of wiring 23110, or three layers of wiring in this example. Alternatively, the control circuit 23013 (i.e., their component Trs) may be formed not in the sensor die 23031 but in the logic die 23024.

The logic die 23024 has Trs formed therein that make up the logic circuit 23014. Also formed in the logic die 23024 is a wiring layer 23161 that includes multiple layers of wiring 23170, or three layers of wiring in this example. Also formed in the logic die 23024 is a connection hole 23171 whose inner wall surface has an insulating film 23172 formed thereon. In the connection hole 23171, a connection conductor 23173 is embedded to connect with the wiring 23170, for example.

The sensor die 23021 and the logic die 23024 are bonded together in such a manner that their wiring layers 23101 and 23161 face each other. This constitutes the stacked-type solid-state imaging apparatus 23020 in which the sensor die 23021 and the logic die 23024 are layered one on top of the other. A film 23191 such as a protective film is formed on the surface over which the sensor die 23021 and the logic die 23024 are bonded together.

A connection hole 23111 is formed in the sensor die 23021 to penetrate therethrough from the back side thereof (through which light is incident on the PD) (top side) to reach the top-layer wiring 23170 of the logic die 23024. Also formed close to the connection hole 23111 in the sensor die 23021 is a connection hole 23121 that reaches the first-layer wiring 23110 from the back side of the sensor die 23021. An insulating film 23112 is formed over the inner wall surface of the connection hole 23111. An insulating film 23122 is formed over the inner wall surface of the connection hole 23121. Then, connection conductors 23113 and 23123 are embedded in the connection holes 23111 and 23121, respectively. The connection conductors 23113 and 23123 are electrically interconnected at the back side of the sensor die 23021. This allows the sensor die 23021 and the logic die 23024 to be interconnected electrically by way of the wiring layer 23101, connection holes 23121 and 23111, and wiring layer 23161.

Figure 13:
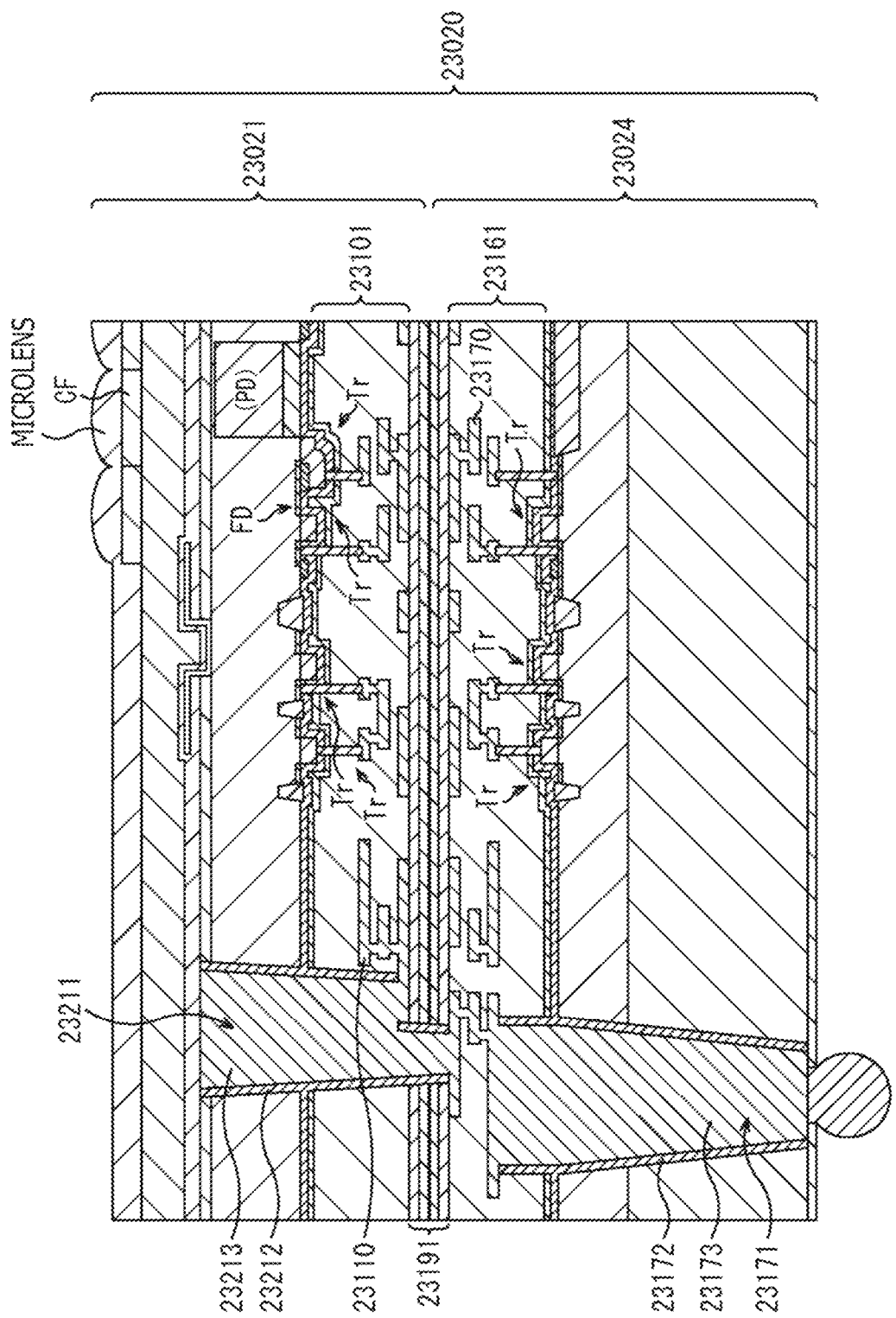
FIG. 13 is a cross-sectional diagram depicting a second configuration example of the stacked-type solid-state imaging apparatus.

FIG. 13 is a cross-sectional diagram depicting a second configuration example of the stacked-type solid-state imaging apparatus 23020.

In the second configuration example of the stacked-type solid-state imaging apparatus 23020, a single connection hole 23211 formed in the sensor die 23021 interconnects electrically the sensor die 23021 (its wiring layer 23101 (with wiring 23110)) and the logic die 23024 (its wiring layer 23161 (with wiring 23170)).

In other words, in FIG. 13, the connection hole 23211 penetrates the sensor die 23021 from the back side thereof to reach both the top-layer wiring 23170 of the logic die 23024 and the top-layer wiring 23110 of the sensor die 23021. An insulating film 23212 is formed over the inner wall surface of the connection hole 23211. A connection conductor 23213 is embedded in the connection hole 23211. In the above-described example of FIG. 12, two connection holes 23111 and 23121 interconnect electrically the sensor die 23021 and the logic die 23024. In FIG. 13, by contrast, one connection hole 23211 interconnects the sensor die 23021 and the logic die 23024 electrically.

Figure 14:
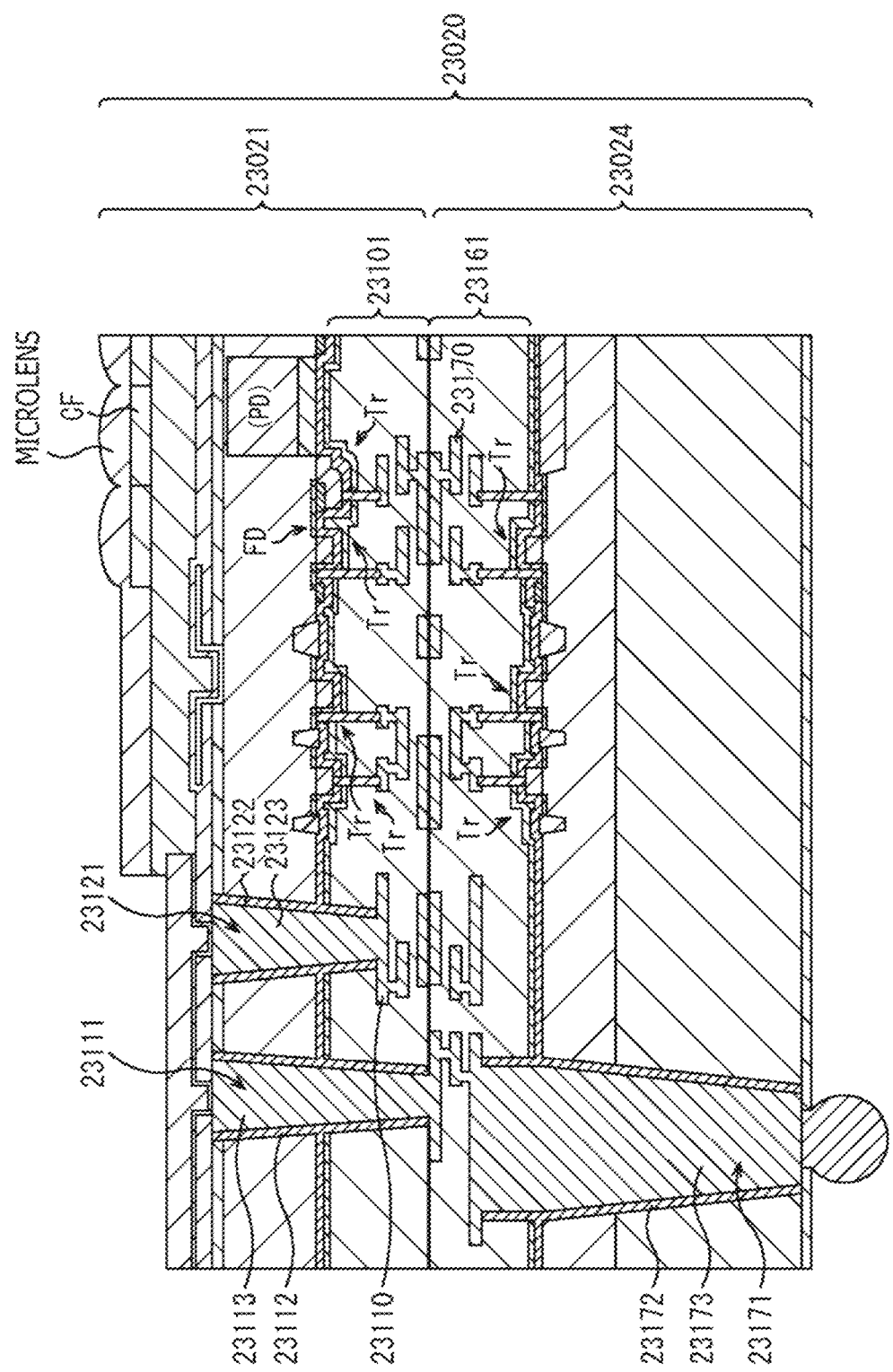
FIG. 14 is a cross-sectional diagram depicting a third configuration example of the stacked-type solid-state imaging apparatus.

FIG. 14 is a cross-sectional diagram depicting a third configuration example of the stacked-type solid-state imaging apparatus 23020.

The stacked-type solid-state imaging apparatus 23020 in FIG. 14 differs from its counterpart in FIG. 12 in that the film 23191 such as a protective film is not formed on the surface over which the sensor die 23021 and the logic die 23024 are bonded together. In the stacked-type solid-state imaging apparatus 23020 in FIG. 12, the film 23191 is formed on the surface over which the sensor die 23021 and the logic die 23024 are bonded together.

The solid-state imaging apparatus 23020 in FIG. 14 is configured with the sensor die 23021 and the logic die 23024 being overlaid one on top of the other in such a manner that the layers of wiring 23110 and 23170 come into direct contact with each other and are heated to be bonded directly together under required load.

Figure 15:
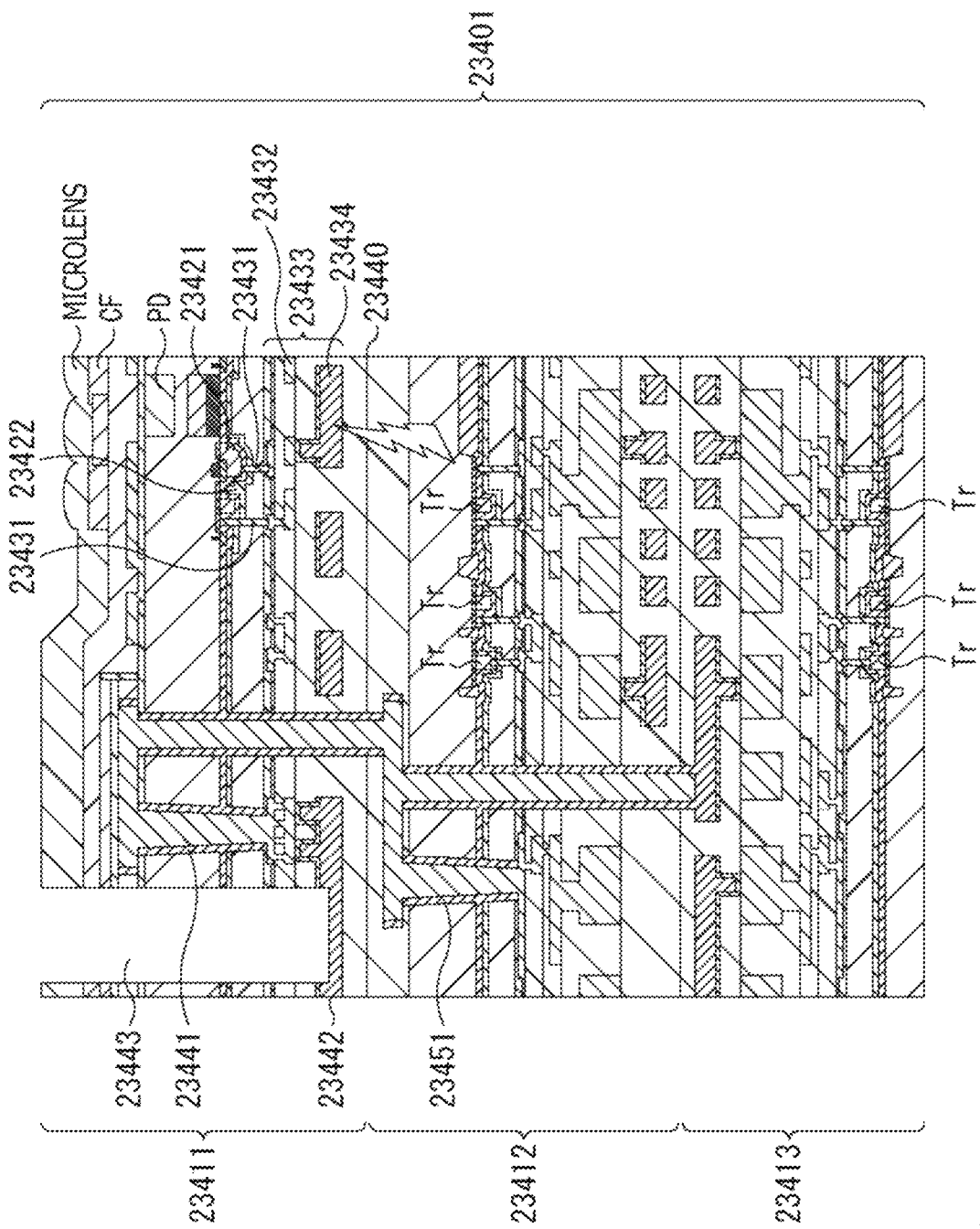
FIG. 15 is a cross-sectional diagram depicting another configuration example of a stacked-type solid-state imaging apparatus to which the technology of the present disclosure can be applied.

FIG. 15 is a cross-sectional diagram depicting another configuration example of a stacked-type solid-state imaging apparatus to which the technology of the present disclosure can be applied.

In FIG. 15, a solid-state imaging apparatus 23401 has a three-layer structure in which a sensor die 23411, a logic die 23412, and a memory die 23413 are stacked one on top of the other.

The memory die 23413 includes, for example, a memory circuit that stores data needed temporarily by the logic die 23412 in processing signals.

In FIG. 15, the logic die 23412 and the memory die 23413 are stacked, in that order, under the sensor die 23411. Alternatively, the logic die 23412 and the memory die 23413 may be stacked in reverse order, i.e., the memory die 23413 on top of the logic die 23412, under the sensor die 23411.

Incidentally, in FIG. 15, the PDs making up the photoelectric converting section for pixels and the source/drain regions of pixel Trs are formed in the sensor die 23411.

A gate electrode is formed around each PD with a gate insulating film interposed therebetween. The gate electrode and the paired source/drain regions constitute pixel Trs 23421 and 23422.

The pixel Tr 23421 adjacent to the PD is a transfer transistor. One of the paired source/drain regions making up the pixel Tr 23421 is the FD.

An interlayer dielectric film is formed also in the sensor die 23411. A connection hole is formed in the interlayer dielectric film. In the connection hole, connection conductors 23431 are formed to connect with the pixel Trs 23421 and 23422.

Also formed in the sensor die 23411 is a wiring layer 23433 that includes multiple layers of wiring 23432 connected with the connection conductors 23431.

In the bottom layer of wiring layer 23433 in the sensor die 23411, an aluminum pad 23434 is formed as an electrode for external connection. In other words, in the sensor die 23411, the aluminum pad 23434 is formed away from the wiring 23432 and close to a bonding plane 23440 with the logic die 23412. The aluminum pad 23434 is used as one end of the wiring for the output and input of signals to and from the outside.

Also formed in the sensor die 23411 is a contact 23441 used for electrical connection with the logic die 23412. The contact 23441 is connected with both a contact 23451 of the logic die 23412 and an aluminum pad 23442 of the sensor die 23411.

Also in the sensor die 23411, a pad hole 23443 is formed to reach the aluminum pad 23442 from the back side (top side) of the sensor die 23411.

The technology of the present disclosure can thus be applied to the solid-state imaging apparatus described above.

7. Example of Application to a Mobile Body

The technology of the present disclosure (the present technology) may be applied to diverse products. For example, the technology may be implemented as an apparatus to be mounted on such mobile bodies as automobiles, electric vehicles, hybrid electric vehicles, motorcycles, bicycles, personal mobility devices, aircraft, drones, ships, and robots.

Figure 16:
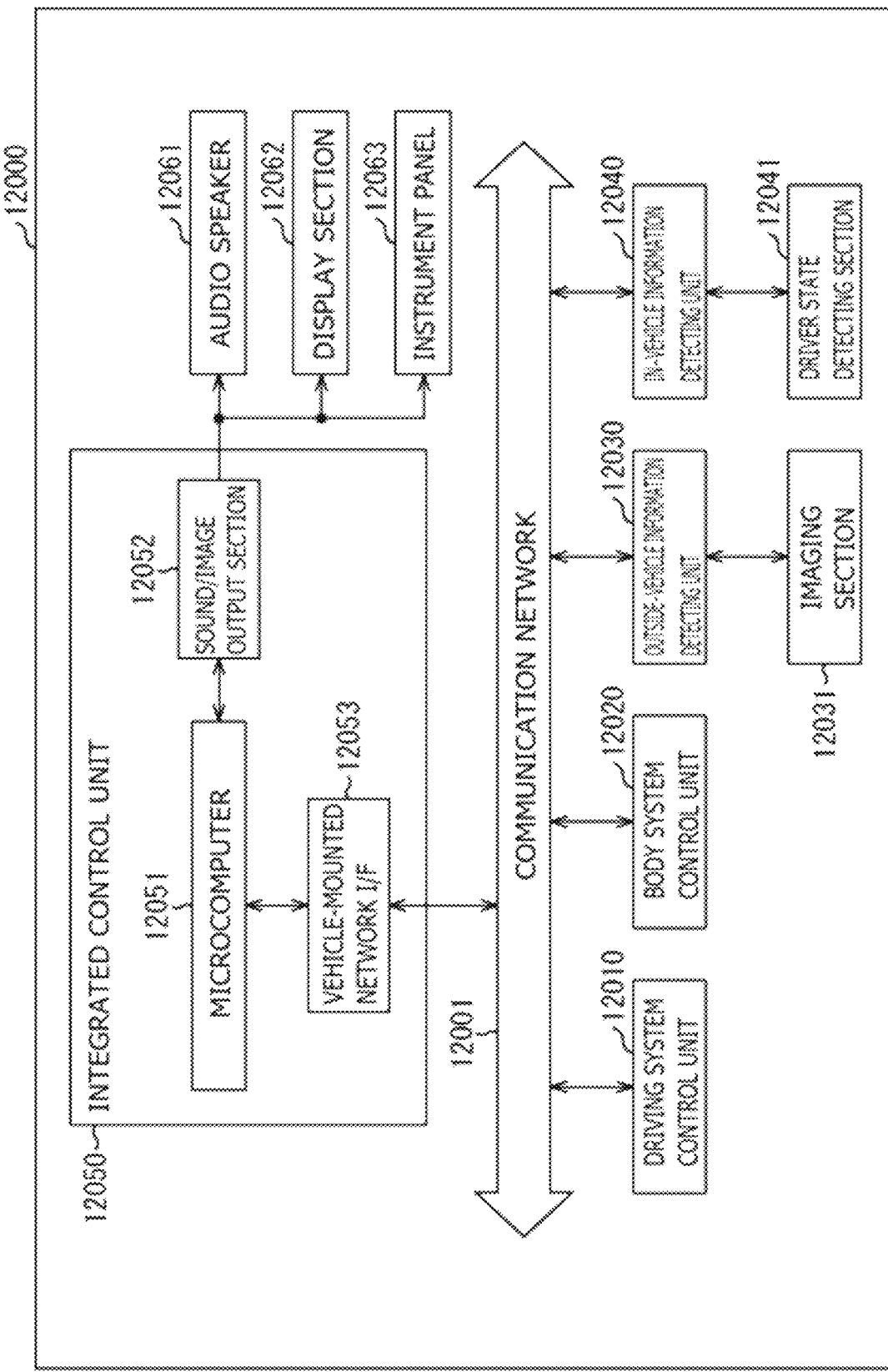
FIG. 16 is a block diagram depicting an example of schematic configuration of a vehicle control system.

FIG. 16 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 16, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 16, an audio speaker 12061, a display section 12062, and an instrument panel 12063 are illustrated as the output device. The display section 12062 may, for example, include at least one of an on-board display and a head-up display.

Figure 17:
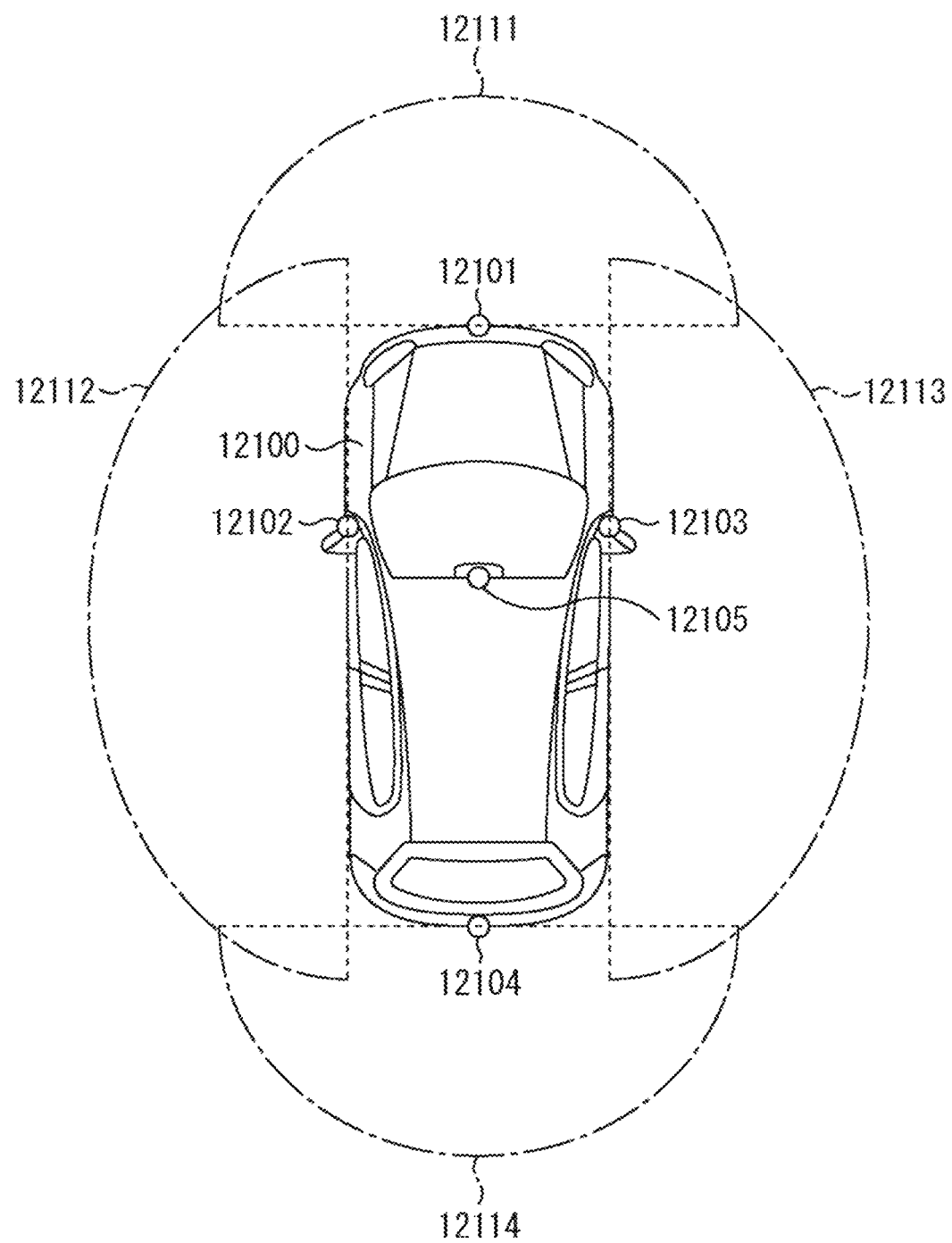
FIG. 17 is a diagram of assistance in explaining an example of installation positions of an outside-vehicle information detecting section and an imaging section.

FIG. 17 is a diagram depicting an example of the installation position of the imaging section 12031.

In FIG. 17, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 17 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Explained above is a typical vehicle control system to which the technology of the present disclosure can be applied. The present technology may be applied to the imaging section 12101 of the system, among other components discussed above. Specifically, the solid-state imaging apparatus 100 in FIG. 5 may be employed as the imaging section 12101. When the present technology is applied to the imaging section 12101, an appropriate output signal is obtained regardless of temperature-induced changes in characteristics, for example. Thus in an environment where the temperature can vary, it is possible to recognize obstacles such as pedestrians more accurately than before.

8. Example of Application to an In-Vivo Information Acquisition System

The technology of the present disclosure (the present technology) may also be applied to other diverse products. For example, the technology may be applied to an endoscopic surgery system.

Figure 18:
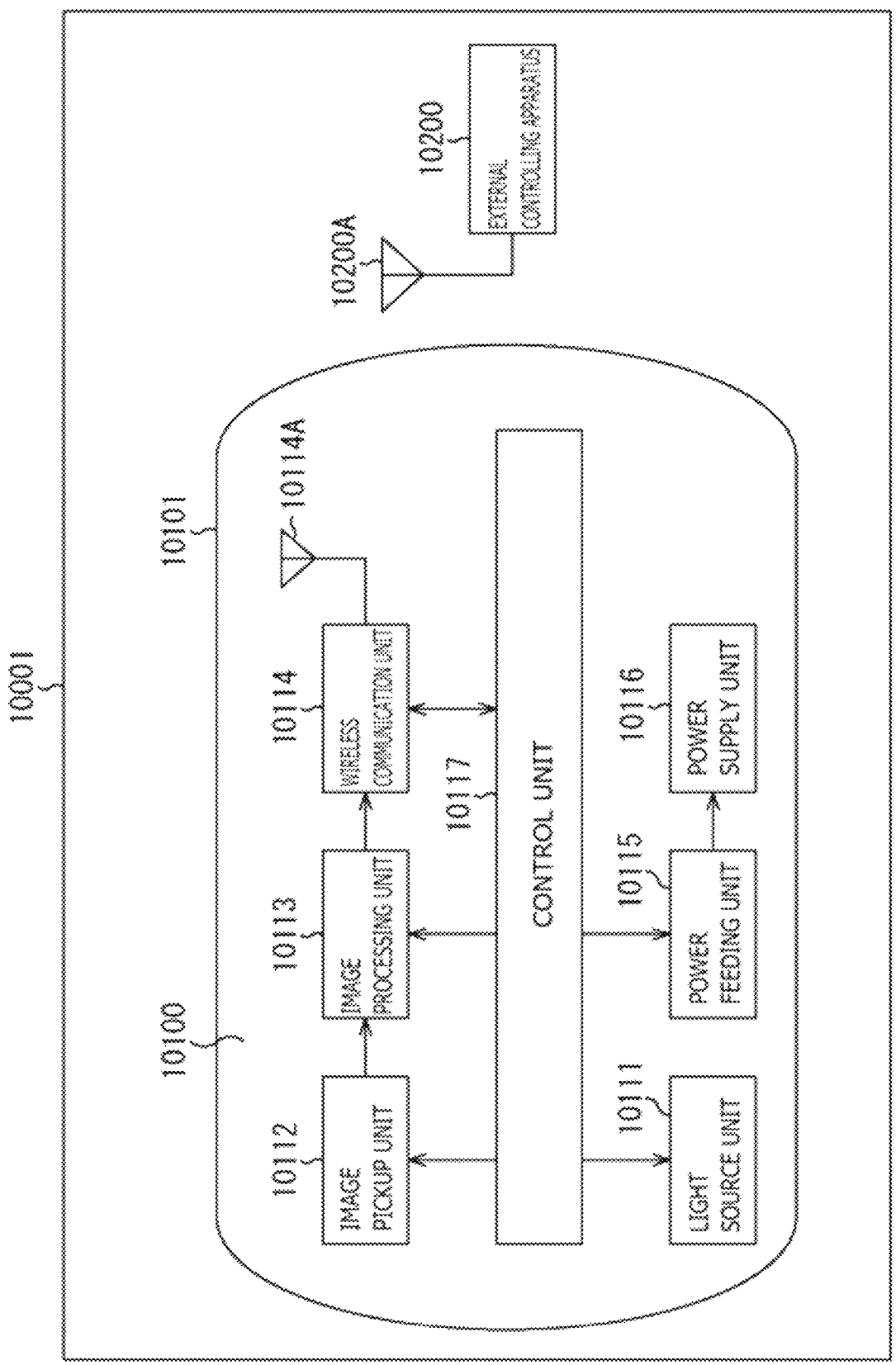
FIG. 18 is a block diagram depicting an example of a schematic configuration of an in-vivo information acquisition system.

FIG. 18 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 18, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

Explained above is a typical in-vivo information acquisition system to which the technology of the present disclosure can be applied. The technology of the present disclosure may be applied to the image pickup unit 10112 of the system, among other components discussed above. Specifically, the solid-state imaging apparatus 100 in FIG. 5 may be employed as the image pickup unit 10112. When the present technology is applied to the image pickup unit 10112, an appropriate output signal is acquired irrespective of temperature-induced changes in characteristics, for example. Thus in an environment where the temperature can vary, it is possible to acquire the in-vivo information regarding the patient more accurately than before.

The embodiments of the technology of the present disclosure (present technology) are not limited to those discussed above and may be modified or altered diversely within the scope of this technology of the present disclosure.

The technology of the present disclosure may be implemented preferably in the following configurations:

(1)

A solid-state imaging apparatus including:

a pixel array section including a first pixel that has a first photoelectric converting section and obtains an output signal with logarithmic characteristics, and a second pixel that obtains a temperature detection signal for detecting temperature, the first and the second pixels being arranged in a matrix pattern; and a correcting section configured to correct the output signal on the basis of temperature information obtained from the temperature detection signal.

(2)

The solid-state imaging apparatus as stated in paragraph (1) above, further including:

a reset voltage setting section configured to set a reset voltage for resetting the first photoelectric converting section on the basis of the temperature information; and a black reference setting section configured to set a black level on the basis of the temperature information, in which the correcting section corrects the output signal obtained with the reset voltage being set, in accordance with an offset amount obtained from the black level.

(3)

The solid-state imaging apparatus as stated in paragraph (2) above, in which the reset voltage setting section sets the reset voltage in such a manner that a period of transition to logarithmic response is as short as possible.

(4)

The solid-state imaging apparatus as stated in paragraph (2) or (3) above, in which the black reference setting section calculates the offset amount by converting a temperature indicated by the temperature information to the black level defined by a thermal equilibrium state of a PN junction.

(5)

The solid-state imaging apparatus as stated in any one of paragraphs (1) to (4) above, in which the pixel array section includes an aperture region and a light blocking region, in which the first pixel is arranged in the aperture region, and the second pixel is arranged in the light blocking region.

(6)

The solid-state imaging apparatus as stated in paragraph (5) above, in which a plurality of the second pixels are arranged in rows or in columns.

(7)

The solid-state imaging apparatus as stated in paragraph (5) or (6) above, in which the second pixel is arranged close to the aperture region.

(8)

The solid-state imaging apparatus as stated in any one of paragraphs (5) to (7) above, in which the second pixel includes:

a second photoelectric converting section;

a capacitor configured to be connected with the second photoelectric converting section to apply a constant current thereto;

a second reset transistor configured to reset the second photoelectric converting section in accordance with a reset signal;

a second amplification transistor configured to amplify a signal from the second photoelectric converting section; and a second selection transistor configured to apply a signal from the second amplification transistor onto a vertical signal line in accordance with a selection signal.

(9)

The solid-state imaging apparatus as stated in any one of paragraphs (5) to (8) above, in which the first pixel includes:

the first photoelectric converting section;

a first reset transistor configured to reset the first photoelectric converting section in accordance with a reset signal;

a first amplification transistor configured to amplify a signal from the first photoelectric converting section; and a first selection transistor configured to apply a signal from the first amplification transistor onto a vertical signal line in accordance with a selection signal.

(10)

The solid-state imaging apparatus as stated in paragraph (2) above, further including:

an A/D converting section configured to convert, from analog to digital form, at least the output signal from the first pixel over the temperature detection signal from the second pixel; and a temperature calculating section configured to calculate the temperature information on the basis of the temperature detection signal in digital or analog form.

(11)

The solid-state imaging apparatus as stated in paragraph (10) above, further including:

a statistical value calculating section configured to calculate a statistical value obtained from the temperature detection signals coming from a plurality of the second pixels that may be arranged in the pixel array section, in which the temperature calculating section calculates the temperature information on the basis of the statistical value obtained from the temperature detection signals.

(12)

The solid-state imaging apparatus as stated in any one of paragraphs (1) to (11) above, in which the solid-state imaging apparatus includes a logarithmic image sensor in solar cell mode.

(13)

A solid-state imaging apparatus including:

a pixel array section including a first pixel arranged in an aperture region and a second pixel arranged in a light blocking region, the first and the second pixels being arranged in a matrix pattern, in which the first pixel includes a first photoelectric converting section, a first reset transistor configured to reset the first photoelectric converting section in accordance with a reset signal, a first amplification transistor configured to amplify a signal from the first photoelectric converting section, and a first selection transistor configured to apply a signal from the first amplification transistor onto a first vertical signal line in accordance with a first selection signal, and the second pixel includes a second photoelectric converting section, a capacitor configured to be connected with the second photoelectric converting section, a second reset transistor configured to reset the second photoelectric converting section in accordance with a reset signal, a second amplification transistor configured to amplify a signal from the second photoelectric converting section, and a second selection transistor configured to apply a signal from the second amplification transistor onto a second vertical signal line in accordance with a selection signal.

(14)

An electronic device having a solid-state imaging apparatus that includes:

a pixel array section including a first pixel that has a photoelectric converting section and obtains an output signal with logarithmic characteristics, and a second pixel that obtains a temperature detection signal for detecting temperature, the first and the second pixels being arranged in a matrix pattern, and a correcting section configured to correct the output signal on the basis of temperature information obtained from the temperature detection signal.

(15)

A driving method for use with a solid-state imaging apparatus that includes:

a pixel array section including a first pixel that is arranged in an aperture region and obtains an output signal with logarithmic characteristics and a second pixel that is arranged in a light blocking region and obtains a temperature detection signal for detecting temperature, the first and the second pixels being arranged in a matrix pattern; and a correcting section configured to correct the output signal on the basis of temperature information obtained from the temperature detection signal, the first pixel including a first photoelectric converting section, a first reset transistor configured to reset the first photoelectric converting section in accordance with a reset signal, a first amplification transistor configured to amplify a signal from the first photoelectric converting section, and a first selection transistor configured to apply a signal from the first amplification transistor onto a vertical signal line in accordance with a selection signal, the second pixel including a second photoelectric converting section, a capacitor configured to be connected with the second photoelectric converting section to apply a constant current thereto, a second reset transistor configured to reset the second photoelectric converting section in accordance with a reset signal, a second amplification transistor configured to amplify a signal from the second photoelectric converting section, and a second selection transistor configured to apply a signal from the second amplification transistor onto a vertical signal line in accordance with a selection signal, the driving method including:

a step of driving the second reset transistor and the second selection transistor in such a manner that the second photoelectric converting section replaces the constant current with a photoelectric current generated through photoelectric conversion in order to obtain the temperature detection signal.

REFERENCE SIGNS LIST

100 Solid-state imaging apparatus, 111I Imaging pixel, 111T Temperature detection pixel, 112 Signal amplifying section, 113 A/D converting section, 114 Mean value calculating section, 115 Temperature calculating section, 116 Reset voltage setting section, 117 Black reference setting section, 118 Offset correcting section, 151 Photodiode, 152 Reset transistor, 153 Amplification transistor, 154 Bias transistor, 155 Amplification transistor, 156 Selection transistor, 171 Photodiode, 172 Reset transistor, 173 Amplification transistor, 174 Bias transistor, 175 Amplification transistor, 176 Selection transistor, 191 Capacitor, 1000 Electronic device, 1001 Solid-state imaging element

The invention claimed is:

1. A solid-state imaging apparatus, comprising:

a pixel array section including a first pixel and a second pixel in a matrix pattern, wherein the first pixel includes a first photoelectric converting section, the first pixel is configured to obtain an output signal with logarithmic characteristics, and the second pixel is configured to obtain a temperature detection signal for calculation of temperature information;

a temperature calculating section configured to calculate the temperature information based on the temperature detection signal;

a reset voltage setting section configured to set a reset voltage to reset the first photoelectric converting section, wherein the reset voltage is set based on the temperature information;

a black reference setting section configured to:
set a black level based on the temperature information; and
calculate an offset amount based on the set black level; and a correcting section configured to correct the output signal based on the set reset voltage and the calculated offset amount.

2. The solid-state imaging apparatus according to claim 1, wherein
the temperature information indicates a temperature,
the black reference setting section is further configured to calculate the offset amount by conversion of the temperature to the black level, and
the black level is defined by a thermal equilibrium state of a PN junction.

3. The solid-state imaging apparatus according to claim 1, wherein
the pixel array section further includes an aperture region and a light blocking region;
the aperture region includes the first pixel, and
the light blocking region includes the second pixel.

4. The solid-state imaging apparatus according to claim 3, wherein
the pixel array section further includes a plurality of second pixels in one of rows or columns of the matrix pattern.

5. The solid-state imaging apparatus according to claim 4, wherein the plurality of second pixels is adjacent to the aperture region in the pixel array section.

6. The solid-state imaging apparatus according to claim 3, wherein the second pixel includes:
a second photoelectric converting section configured to output a first signal;
a capacitor configured to:
connect with the second photoelectric converting section; and
apply a constant current to the connected second photoelectric converting section;
a second reset transistor configured to reset the second photoelectric converting section based on a reset signal;
a second amplification transistor configured to:
amplify the first signal output from the second photoelectric converting section; and
output a second signal based on the amplification of the first signal; and
a second selection transistor configured to apply the second signal output from the second amplification transistor onto a vertical signal line, wherein the second signal is applied onto the vertical signal line based on a selection signal.

7. The solid-state imaging apparatus according to claim 3, wherein the first photoelectric converting section is configured to output a first signal, and the first pixel further includes:

a first reset transistor configured to reset the first photoelectric converting section based on a reset signal;
a first amplification transistor configured to:
amplify the first signal output from the first photoelectric converting section; and
output a second signal based on the amplification of the first signal; and
a first selection transistor configured to apply the second signal output from the first amplification transistor onto a vertical signal line, wherein the second signal is applied onto the vertical signal line based on a selection signal.

8. The solid-state imaging apparatus according to claim 1, further comprising
an A/D converting section configured to convert, from an analog form to a digital form, the output signal from the first pixel and the temperature detection signal from the second pixel, wherein
the temperature calculating section is further configured to calculate the temperature information based on at least one of the analog form or the digital form of the temperature detection signal.

9. The solid-state imaging apparatus according to claim 8, further comprising a statistical value calculating section configured to:
obtain a plurality of temperature detection signals from a plurality of second pixels in the pixel array section, wherein each temperature detection signal of the plurality of temperature detection signals corresponds to a respective second pixel of the plurality of second pixels; and
calculate a statistical value based on the obtained plurality of temperature detection signals,
wherein the temperature calculating section is further configured to calculate the temperature information based on the calculated statistical value.

10. The solid-state imaging apparatus according to claim 1, wherein the solid-state imaging apparatus includes a logarithmic image sensor in solar cell mode.

11. A solid-state imaging apparatus, comprising:
a pixel array section including an aperture region and a light blocking region, wherein
the aperture region includes a first pixel,
the light blocking region includes a second pixel,
the first pixel and the second pixel are in a matrix pattern,
the first pixel includes:
a first photoelectric converting section configured to output a first output signal;
a first reset transistor configured to reset the first photoelectric converting section based on a first reset signal;
a first amplification transistor configured to:
amplify the first output signal from the first photoelectric converting section; and
output a second output signal based on the amplification of the first output signal; and
a first selection transistor configured to apply the second output signal from the first amplification transistor onto a first vertical signal line based on a first selection signal, and
the second pixel includes:
a second photoelectric converting section configured to output a third output signal;
a capacitor configured to connect with the second photoelectric converting section;

a second reset transistor configured to reset the second photoelectric converting section based on a second reset signal;
a second amplification transistor configured to:
amplify the third output signal from the second photoelectric converting section; and
output a fourth output signal based on the amplification of the third output signal; and
a second selection transistor configured to apply the fourth output signal from the second amplification transistor onto a second vertical signal line based on a second selection signal.

12. An electronic device, comprising:
a solid-state imaging apparatus that includes:
a pixel array section including a first pixel and a second pixel in a matrix pattern, wherein
the first pixel includes a photoelectric converting section,
the first pixel is configured to obtain an output signal with logarithmic characteristics, and
the second pixel is configured to obtain a temperature detection signal for calculation of temperature information;
a temperature calculating section configured to calculate the temperature information based on the temperature detection signal;
a reset voltage setting section configured to set a reset voltage to reset the photoelectric converting section, wherein the reset voltage is set based on the temperature information;
a black reference setting section configured to:
set a black level based on the temperature information; and
calculate an offset amount based on the set black level; and
a correcting section configured to correct the output signal based on the set reset voltage and the calculated offset amount.

13. A driving method, comprising:
in a solid-state imaging apparatus that includes:
a pixel array section that includes an aperture region and a light blocking region, wherein
the aperture region includes a first pixel,
the first pixel is configured to obtain an output signal with logarithmic characteristics,
the light blocking region includes a second pixel,
the second pixel is configured to obtain a temperature detection signal for calculation of temperature information, and the first pixel and the second pixel are in a matrix pattern; and
a correcting section configured to correct the output signal based on the temperature information, wherein
the first pixel includes:
a first photoelectric converting section configured to output a first output signal;
a first reset transistor configured to reset the first photoelectric converting section based on a first reset signal;
a first amplification transistor configured to:
amplify the first output signal from the first photoelectric converting section; and
output a second output signal based on the amplification of the first output signal; and
a first selection transistor configured to apply the second output signal from the first amplification transistor onto a first vertical signal line based on a first selection signal, and the second pixel includes:
a second photoelectric converting section configured to output a third output signal;
a capacitor configured to connect with the second photoelectric converting section to apply a constant current;
a second reset transistor configured to reset the second photoelectric converting section based on a second reset signal;
a second amplification transistor configured to:
amplify the third output signal; and
output a fourth output signal based on the amplification of the third output signal; and
a second selection transistor configured to apply the fourth output signal from the second amplification transistor onto a second vertical signal line based on a second selection signal;
generating a photoelectric current based on a photoelectric conversion process;
driving the second reset transistor and the second selection transistor to replace the constant current with the generated photoelectric current; and
obtaining the temperature detection signal based on the driving of the second reset transistor and the second selection transistor.

* * * * *